(12) United States Patent
Tanaka et al.

(10) Patent No.: US 8,076,974 B2
(45) Date of Patent: Dec. 13, 2011

(54) RADIO FREQUENCY (RF) POWER AMPLIFIER AND RF POWER AMPLIFIER APPARATUS

(75) Inventors: Satoshi Tanaka, Tokyo (JP); Tomonori Tanoue, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/980,627

(22) Filed: Dec. 29, 2010

(65) Prior Publication Data

US 2011/0095827 A1 Apr. 28, 2011

Related U.S. Application Data

(63) Continuation of application No. 12/412,728, filed on Mar. 27, 2009, now Pat. No. 7,876,156.

(30) Foreign Application Priority Data

May 20, 2008 (JP) ................................. 2008-131421

(51) Int. Cl.
*H03G 3/30* (2006.01)
(52) U.S. Cl. ........................................ 330/285; 330/279
(58) Field of Classification Search .................... 330/98, 330/278, 279, 285, 310
See application file for complete search history.

(56) References Cited

U.S. PATENT DOCUMENTS

| | | | |
|---|---|---|---|
| 7,193,471 B2 | 3/2007 | Tsutsui et al. | |
| 7,605,651 B2 * | 10/2009 | Ripley et al. .................. | 330/285 |
| 2008/0150637 A1 | 6/2008 | Takahashi et al. | |

OTHER PUBLICATIONS

McCune, High-Efficiency, Multi-Mode, Multi-Band Terminal Power Amplifiers, IEEE microwave magazine, Mar. 2005, pp. 44-55.
Zhang et al., A Novel Power-Amplifier Module for Quad-Band Wireless Handset Applications, IEEE Transactions on Microwave Theory and Techniques, vol. 51, No. 11, Nov. 2003, pp. 2203-2210.
Hau et al., High Efficiency, Wide Dynamic Range Variable Gain and Power Amplifier MMICs for Wide-Band CDMA Handsets, IEEE Microwave and Wireless Components Letters, vol. 11, No. 1, Jan. 2001, pp. 13-15.
Scuderi et al., A VSWR-Protected Silicon Bipolar RF Power Amplifier With Soft-Slope Power Control, IEEE Journal of Solid-State Circuits, vol. 40, No. 3, Mar. 2005, pp. 611-621.
Ikeda et al., A Low Distortion and High Efficiency Parallel-Operation Power Amplifier Combined in Different Phases in Wide Range of Load Impedances, 1996 IEEE MTT-S Digest, pp. 535-538.
Berretta et al., A Balanced CDMA2000 SiGe HBT Load Insensitive Power Amplifier, 2006 IEEE Radio and Wireless Symposium, Jan. 17-19, 2006, pp. 523-526.

* cited by examiner

*Primary Examiner* — Khanh Nguyen
(74) *Attorney, Agent, or Firm* — Mattingly & Malur, PC

(57) ABSTRACT

An RF power amplifier has a final-stage amplifier stage which generates an RF transmit output signal, a signal detector which detects an RF transmit output level, a first detector, a second detector and a control circuit. The final-stage amplifier stage includes a transistor and a load element and performs saturation type nonlinear amplification and non-saturation type linear amplification. The first detector and the control circuit maintain the RF transmit output signal approximately constant with respect to a variation in load at an antenna at the saturation type nonlinear amplification. The second detector and the control circuit reduce an increase in the output voltage of the final stage transistor with respect to an overload state of the antenna at the non-saturation type linear amplification.

3 Claims, 9 Drawing Sheets

RADIO FREQUENCY (RF) POWER AMPLIFIER AND RF POWER AMPLIFIER APPARATUS

CROSS-REFERENCE TO RELATED APPLICATIONS

This is a continuation application of U.S. application Ser. No. 12/412,728, filed Mar. 27, 2009, now allowed, the contents of which are hereby incorporated by reference into this application.

The disclosure of Japanese Patent Application No. 2008-131421 filed on May 20, 2008 including the specification, drawings and abstract is incorporated herein by reference in its entirety.

BACKGROUND OF THE INVENTION

The present invention relates to an RF power amplifier and an RF power amplifier apparatus for RF transmission, each of which is mounted in a communication terminal device like a cellular phone terminal that communicates with a base station. Further, the present invention particularly relates to a technique beneficial to realize two functions of a non-saturation type linear amplifier and a saturation type nonlinear amplifier by one RF power amplifier.

The operation of a high-frequency power amplifier included in a cellular phone terminal has a saturation operation in GSM of a basic mode in which only phase modulation is used. EDGE that uses amplitude modulation along with phase modulation has linear operation at an operating point where several dB are backed off from a saturation operating point of GSM. Even in the case of WCDMA and cdma-1x that also use amplitude modulation along with phase modulation, the operation of the high-frequency power amplifier has linear operation.

At a high-frequency circuit portion of the cellular phone terminal corresponding to each of GSM and EDGE, an antenna switch is disposed between the high-frequency power amplifier and an antenna. The antenna switch performs the function of switching between transmission and reception slots of a TDMA (Time Division Multiple Access) system.

At a high-frequency circuit portion of a cellular phone terminal corresponding to each of WCDMA and cdma-1x, a duplexer is disposed between a high-frequency power amplifier and its corresponding antenna. The duplexer performs the function of processing in parallel, transmission of an RF transmit signal of a low RF frequency of a CDMA (Code-Division Multiple Access) system and reception of an RF receive signal of a high RF frequency thereof. Further, in WCDMA and cdma-1x or the like, an isolator is disposed between the high-frequency power amplifier and the duplexer to avoid the influence of a variation in load at the antenna over the high-frequency power amplifier. Since it is however difficult for the isolator to be integrated into a structure at which the high-frequency power amplifier is manufactured, it becomes a large and expensive part.

Ubiquitous coverage corresponding to the capability of a communication terminal device such as a cellular phone terminal that wireless communications are carried out in any place in the world is not real in these days, but now proceeding into development.

According to a non-patent document 1 (Earl McCune, "High-Efficiency, Multi-Mode, Multi-Band Terminal Power Amplifiers", IEEE microwave magazine, March 2005, PP. 44-55), these mobile systems respectively include cells of GSM, GPRS, EDGE and WCDMA, and networks of, for example, IEEE 802.11-b, -a and -g or the like, such as personal area networks such as Bluetooth and ZigBee. The characteristics of these systems extend to signals for a constant envelope and a change in envelope, multiplex time division and code division and a wider combination of transmit output power from high (few watts) to low (micro watts). As a result, there has been a growing demand for a multimode-applied RF power amplifier.

A self-evident approach to the multimode is to apply a linear circuit technique in order to support an envelope change signal. This approach however causes a basic contradiction in the circuit design of a power amplifier. As is well known, the maximum efficiency of the power amplifier is obtained by allowing the power amplifier to perform a saturation operation (nonlinear operation at which waveform clips occur). Since the power amplifier that performs the saturation operation operates as a limiter where an input signal is of an envelope change signal, serious signal distortion occurs. Thus, the power amplifier needs to perform a non-saturation linear operation in order to reproduce the envelope change signal faithfully. To this end, the concept of output back-off is introduced and the power amplifier is limited to the linear operation at which the peak output power of the power amplifier that performs the non-saturation linear operation is lower than the maximum (saturated) output power. Since, however, the output back-off becomes difficult in design, two discrete power amplifiers corresponding to a non-saturation type linear amplifier and a saturation type nonlinear amplifier have been developed.

Incidentally, GSM is an abbreviation of Global System for Mobile Communication. GPRS is an abbreviation of General Packet Radio Service. Further, EDGE is an abbreviation of Enhanced Data for GSM Evolution (Enhanced Data for GPRS). WCDMA is an abbreviation of Wideband Code Division Multiple Access.

On the other hand, an RF power amplifier module that transmits a quadband including frequency bands of GSM850, GSM900, DCS1800 and PCS1900 has been described in non-patent document 2 (Shuyun Zhang et al, "A Novel Power-Amplifier Module for Quad-Band Wireless Handset Applications", IEEE TRANSACTIONS ON MICROWAVE THEORY AND TECHNIQUES, VOL. 51, No. 11, NOVEMBER 2003, PP. 2203-2210). Incidentally, DCS is an abbreviation of a Digital Cellular System and PCS is an abbreviation of a Personal Communication System. The RF power amplifier module includes a first power amplifier which amplifies a first RF transmit input signal having a first frequency band of GSM850 and GSM900, and a second power amplifier which amplifies a second RF transmit input signal having a second frequency band of DCS1800 and PCS1900.

In communications of GSM850, GSM900, DCS1800 and PCS1900, a TDMA system has been adopted which is capable of setting a plurality of time slots to any of an idle state, a reception operation from a base station and a transmission operation to the base station, respectively, on a time-sharing basis. Incidentally, TDMA is an abbreviation of Time-Division Multiple Access. As one TDMA system, there is known a GSM system that uses only phase modulation. There is also known a system that improves a communication data transfer rate as compared with the GSM system. As an improvement system, an EDGE system that uses amplitude modulation along with the phase modulation has recently been brought to attention.

On the other hand, a WCDMA system that has improved a communication data transfer rate by using amplitude modulation along with phase modulation has also been a focus of attention in recent years in a manner similar to the EDGE system. In this WCDMA system, there has been adopted a frequency-division CDMA system other than the TDMA system, which uses frequencies of 2110 MHz to 2170 MHz for a reception operation from a base station and uses frequencies of 1920 MHz to 1980 MHz for a transmission operation to the base station. Incidentally, CDMA is an abbreviation of Code Division Multiple Access.

A non-patent document 3 (Gary Hau et al, "High Efficiency, Wide Dynamic Range Variable Gain and Power Amplifier MMICs for Wide-Band CDMA Handsets", IEEE MICROWAVE AND WIRELESS COMPONENTS LETTERS, VOL. 11, No. 1, JANUARY 2001, PP. 13-15) has described that since a wider control range and high linearity are necessary for power control of an RF power amplifier of the WCDMA system, a programmable gain amplifier using a variable attenuator is coupled to the input of the RF power amplifier.

On the other hand, power control of an RF power amplifier by a closed loop and source voltage control has been described in a non-patent document 4 (Angelo Scuderi et al, "A VSWR-Protected Silicon Bipolar RF Power Amplifier With Soft-Slop Power Control", IEEE JOURNAL OF SOLID-STATE CIRCUITS, VOL. 40, No. 3, MARCH 2005, PP. 611-621). In the power control by the closed loop, RF power output of the amplifier is sensed using a directional coupler and detected by a diode. A detected voltage is compared with a reference voltage by an error amplifier. The output of the error amplifier drives a gain control terminal of the power amplifier to equally control the detected voltage and the reference voltage by the closed loop. The power control is realized by a change in the reference voltage. In the source voltage control of the RF power amplifier, which controls the output power thereof, a linear regulator configured by a power PMOS transistor and an operational amplifier is used, and a collector voltage of the RF power amplifier is linearly changed by a control terminal of the operational amplifier. The output amplitude at which power is obtained is limited by reducing the collector voltage.

Closed-loop collector peak voltage control for coping with a breakdown based on a high voltage peak at the collector of a final stage in a state of a high-load voltage standing wave ratio (VSWR) caused by load mismatching has been described in the non-patent document 4. This control is configured by an AC sense circuit/envelope detector that detect a peak voltage at an output collector node, and an error amplifier which changes circuit gain thereby to clamp the peak voltage to a specific threshold voltage. The error amplifier controls a bias current of a drive stage for driving the final stage.

A parallel power amplifier that realizes low distortion and high efficiency at a wide range of load impedance without using an isolator has been described in a non-patent document 5 (Hikaru Ikeda et al, "A Low Distortion and High Efficiency Parallel-Operation Power Amplifier Combined in Different Phases in Wide Range of Load Impedance", 1996 IEEE MTT-S Digest, pp. 535-538). The parallel power amplifier has a plurality of amplification paths. A signal inputted to one input terminal is supplied to the inputs of the amplification paths by a hybrid divider. Each of the amplification paths includes an amplifier and a phase shifter. The phase shifters are disposed on their corresponding amplification paths in such a manner that the phases of operations of the amplifiers differ from one another at the amplification paths. Plural outputs of the amplification paths are coupled to a single output by a hybrid coupler. The non-patent document 5 has described that at a 3:1 VSWR (Voltage Standing-Wave Ratio) or less in which reflectivity $\Gamma$ is equivalent to 0.5, a distortion of −45 dBc or less, an efficiency of 45% or more and a gain of 9.8 dB or more have been obtained. Incidentally, VSWR is an abbreviation of Voltage Standing-Wave Ratio. VSWR is determined by VSWR=(1+$\Gamma$)/(1−$\Gamma$) in accordance with reflectivity $\Gamma$.

A balanced amplifier similar to the parallel power amplifier described in the non-patent document 5 has been described in a non-patent document 6 (Giuseppe Berrtta et al, "A balanced CDMA SiGe HBT Load Insensitive Power Amplifier", 2006 IEEE Radio and Wireless Symposium 17-19 Jan. 2006, PP. 523-526) to adapt to the mismatching of a load due to the omission of the isolator. The balanced amplifier includes an input hybrid coupler, two RF power amplifiers, two matching circuits, an output hybrid coupler and two 50Ω terminal resistors. The supply of an RF input signal to input-side two terminals of the input hybrid coupler and the coupling of the 50Ω input terminal resistors thereto are carried out. Two input terminals of the two RF power amplifiers are coupled to their corresponding two output-side terminals of the input hybrid coupler. Two input terminals of the two matching circuits are coupled to their corresponding two output terminals of the two RF power amplifiers. Two input-side terminals of the output hybrid coupler are coupled to their corresponding two output terminals of the two matching circuits. The coupling of the 50Ω output terminal resistors to their corresponding two output-side terminals of the output hybrid coupler and the coupling of an antenna thereto are carried out. The parallel power amplifier demonstrates a satisfactory input/output return loss and has insensitivity satisfactory for variations in a load.

SUMMARY OF THE INVENTION

Prior to the present invention, the present inventors have been involved in the development of an RF power amplifier module that transmits five frequency bands of GSM850, GSM900, DCS1800, PCS1900 and WCDMA2100.

In the development of the RF power amplifier module prior to the present invention, miniaturization of the RF power amplifier module was required to achieve a further scale-down of a cellular phone terminal that supports multimode communications of GSM, EDGE and WCDMA. It was therefore necessary to realize two functions of a non-saturation type linear amplifier and a saturation type nonlinear amplifier by one RF power amplifier. As described in the non-patent document 1, the two discrete power amplifiers of the non-saturation type linear amplifier and the saturation type nonlinear amplifier have heretofore been developed and used due to the design difficulty. However, the use of the two discrete power amplifiers will no longer be allowed to achieve further scaling down of the cellular phone terminal that supports the multimode communications.

In GSM communications at GSM850, GSM900, DCS1800 and PCS1900, a constant envelope signal called "GMSK" is used. Incidentally, GMSK is an abbreviation of Gaussian minimum shift keying. On the other hand, an envelope change signal called "3π/8-8PSK" is used in EDGE communications at GSM850, GSM900, DCS1800 and PCS1900. Incidentally, 3π/8-8PSK is an abbreviation of 8-phase-shift keying with a 3π/8 phase shift added cumulatively to each symbol". In communications at WCDMA, an envelope change signal called "HPSK" is used. Incidentally, HPSK is an abbreviation of Hybrid phase shift keying.

Thus, the present inventors have achieved the idea that one RF power amplifier is commonly used in the saturation type nonlinear amplifier and the non-saturation type linear amplifier, and the operations of a first operation mode for saturation type nonlinear amplification and a second operation mode for non-saturation type linear amplification are executed.

Namely, upon transmission of the GMSK constant envelope signal in the GSM communications, the operation mode of one RF power amplifier is set to the first operation mode for the saturation type nonlinear amplification thereby to make it possible to realize a high-efficient operation. Upon transmission of the envelope change signals at 3π/8-8PSK in the EDGE communications and HPSK in the WCDMA communications, the operation mode of one RF power amplifier is set to the second operation mode for the non-saturation type linear amplifier thereby to make it possible to reduce signal distortion of the envelope change signal.

Prior to the present invention, the present inventors have discussed that the balanced RF power amplifier excellent in load variation suppression characteristic described in each of the non-patent documents 5 and 6 is applied to the RF power amplifier module that transmits the five frequency bands of GSM850, GSM900, DCS1800, PCS1900 and WCDMA2100. The balanced RF power amplifier adopts such a configuration that RF input signals different by 90° in phase are supplied to the two RF power amplifiers by the input hybrid coupler, and their phases are further rotated 90° by the output hybrid coupler based on the outputs of the two matching circuits. Even if the mismatch of impedance between the output of each power amplifier and the antenna occurs in the balanced RF power amplifier, the whole ACPR (adjacent channel leakage power ratio) of the balanced power amplifier can be rendered satisfactory. This is because the impedance transformation of the power amplifier for one of the two amplification paths becomes an inductive rotation on the Smith chart, and the impedance transformation of the power amplifier for the other thereof becomes a capacitive rotation on the Smith chart. As a result, when one impedance is brought to high impedance, the other impedance becomes low impedance, thereby making it possible to correct distortion of a combined signal.

When, however, errors from 90° occur in the phase rotations between the input hybrid coupler and the output hybrid coupler in the balanced RF power amplifier, losses occur in the matching circuits, thus leading to a reduction in efficiency. Since the input and output hybrid couplers are respectively comprised of circuits complex and large in the number of elements and include resistors along with a plurality of capacitors and a plurality of inductors, the problem that the loss in each resistor occurs and high efficiency is difficult has been revealed.

Thus, the present inventors have taken one RF power amplifier which is commonly used in the saturation type nonlinear amplifier and the non-saturation type linear amplifier based on the above idea and whose operation is switched to the first operation mode for the saturation type nonlinear amplification and the second operation mode for the non-saturation type linear amplification, as the general signal type without being taken as the balanced type.

Thus, it has been revealed that one RF power amplifier which is commonly used in the saturation type nonlinear amplifier and non-saturation type linear amplifier of the general single type and whose operation is switched to the first operation mode and the second operation mode, needs to cope with a variation in load.

Further, it has also been revealed that there is a need to reduce the adjacent channel leakage power ratio (ACPR) of the single type commonly-used RF power amplifier upon adaptation to the load variation in the second operation mode for the non-saturation type linear amplification. Incidentally, ACPR is an abbreviation of Adjacent Channel Power leakage Ratio.

It has been demonstrated by discussions of the present inventors that when the load of the antenna is extremely small, there is a need to suppress the wasting of a battery for the cellular phone terminal and suppress an operating current flowing through a transistor of a final-stage amplifier stage in the single type commonly-used RF power amplifier upon GSM communications large particularly in RF transmit power. Namely, it has been revealed by the present inventors that if the operating current is not suppressed in such a case, then the battery is wasted abruptly, and characteristic degradation of the transistor of the final-stage amplifier stage occurs and a current breakdown occurs.

The present invention has been made as a result of the discussions of the present inventors prior to the present invention referred to above.

Thus, an object of the present invention is to cope with a load variation and an overload state in one RF power amplifier which is commonly used in general single type saturation-type nonlinear and non-saturation type linear amplifiers and which executes a first operation mode for saturation type nonlinear amplification and a second operation mode for non-saturation type linear amplification.

Another object of the present invention is to reduce an adjacent channel leakage power ratio (ACPR) in an overload state of a single type commonly-used RF power amplifier upon adaptation to a load variation in a second operation mode for non-saturation type linear amplification.

A further object of the present invention is to suppress an operating current that flows through a transistor of a final-stage amplifier stage of a single type commonly-used RF power amplifier where the load of an antenna is extremely small, upon GSM communications large particularly in RF transmit power.

The above and other objects and novel features of the present invention will become apparent from the description of the present specification and the accompanying drawings.

A representative embodiment of the present invention disclosed in the present application will be described in brief as follows:

A typical RF power amplifier (100) of the present invention has a final-stage amplifier stage (11) which amplifies an RF signal to generate an RF transmit output signal ($P_{OUT}$) supplied to an antenna of a communication terminal, and a signal detector (13) which detects the level of the RF transmit output signal. The final-stage amplifier stage includes a final stage transistor (Qn2) and a final stage load element (L2) and executes a first operation mode for saturation type nonlinear amplification and a second operation mode for non-saturation type linear amplification.

The RF power amplifier (100) further includes a first detector (14), a second detector (17) and a controller or control circuit (15, 16 and 18). The first detector (14) is supplied with an RF detection signal from the signal detector (13). The second detector (17) is supplied with an output voltage (Vds) of the final stage transistor.

First feedback control by the first detector and the control circuit reduces a variation in the RF transmit output signal ($P_{OUT}$) generated from the final stage transistor responsive to a variation in load at the antenna in the first operation mode.

Second feedback control by the second detector and the control circuit reduces an increase in the output voltage (Vds) of the final stage transistor responsive to an overload state of the antenna in the second operation mode (refer to FIG. 1).

Advantageous effects obtained by a representative embodiment of the present invention disclosed in the present application will be explained in brief as follows: According to the present invention, it is possible to cope with a load variation and an overload state in one RF power amplifier which is commonly used in general single type saturation-type nonlinear and non-saturation type linear amplifiers and which executes a first operation mode for saturation type nonlinear amplification and a second operation mode for non-saturation type linear amplification.

According to the present invention as well, it is possible to reduce an adjacent channel leakage power ratio (ACPR) in an overload state of a single type commonly-used RF power amplifier upon adaptation to a load variation in a second operation mode for non-saturation type linear amplification.

DETAILED DESCRIPTION OF THE PREFERRED EMBODIMENTS

Representative Embodiments

Figure 1:
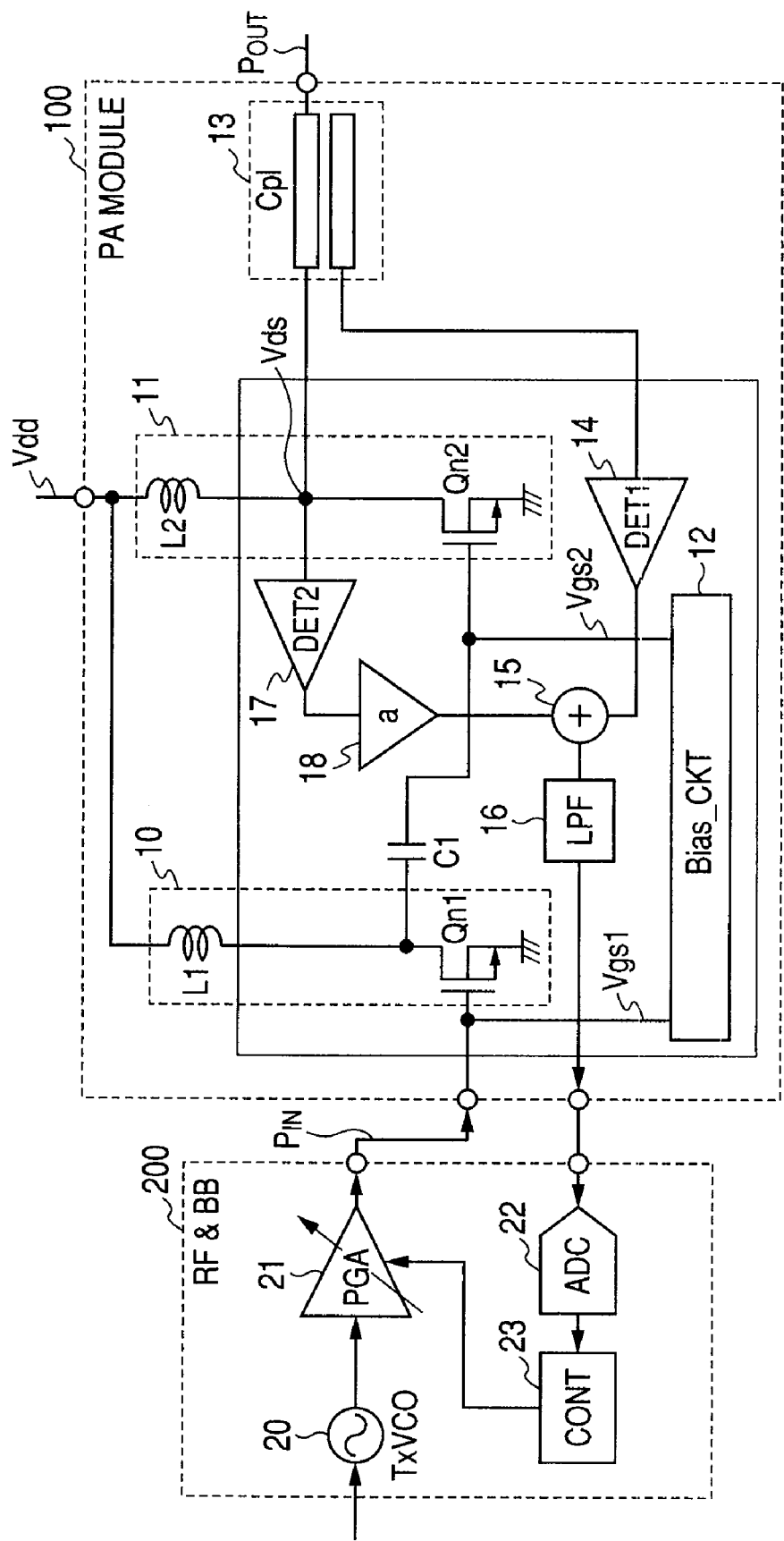
FIG. 1 is a diagram showing a configuration of a cellular phone terminal including an RF power amplifier according to an embodiment of the present invention and a baseband digital signal processing/RF analog signal processing unit for supplying an RF transmit signal to the RF power amplifier.

A summary of representative embodiments of the invention disclosed in the present application will first be explained. Reference numerals in the figures which are referred to with parentheses in the outline description of the typical embodiments just exemplify ones contained in concepts of components to which the reference numerals are attached respectively.

[1] An RF power amplifier (100) according to a typical embodiment of the present invention includes a final-stage amplifier stage (11) which amplifies an RF signal to generate an RF transmit output signal ($P_{OUT}$) supplied to an antenna of a communication terminal, and a signal detector (13) which detects the level of the RF transmit output signal.

The final-stage amplifier stage includes a final stage transistor (Qn2) which generates the RF transmit output signal at its output electrode, and a final stage load element (L2) coupled between the output electrode of the final stage transistor and a source or power supply voltage (Vdd). The final-stage amplifier stage executes a first operation mode for saturation type nonlinear amplification and a second operation mode for non-saturation type linear amplification.

An input terminal of the signal detector (13) is coupled to the output electrode of the final stage transistor to thereby generate an RF detection signal responsive to the level of the RF transmit output signal from an output terminal of the signal detector.

The RF power amplifier (100) further includes a first detector (14), a second detector (17) and a controller or control circuit (15, 16 and 18).

An input terminal of the first detector (14) is supplied with the RF detection signal from the output terminal of the signal detector (13) to thereby generate a first detection signal from an output terminal of the first detector (14).

An input terminal of the second detector (17) is coupled to the output electrode of the final stage transistor to thereby generate a second detection signal from an output terminal of the second detector (17).

The first detection signal generated from the output terminal of the first detector (14) contains a first detection component responsive to a variation in the level of the RF transmit output signal due to a variation in load at the antenna when the RF power amplifier (100) operates in the first operation mode for the saturation type nonlinear amplification.

The second detection signal generated from the output terminal of the second detector (17) contains a second detection component responsive to an increase in output voltage (Vds) of the output electrode of the final stage transistor (Qn2) due to an overload state of the antenna when the RF power amplifier (100) operates in the second operation mode for the non-saturation type linear amplification.

The first detector (14) and the second detector (17) respectively have a first input threshold voltage (Vth1) and a second input threshold voltage (Vth2). The level of the second input threshold voltage is set higher than the level of the first input threshold voltage.

The first detection signal generated from the output terminal of the first detector and the second detection signal generated from the output terminal of the second detector are supplied to the control circuit (15, 16 and 18). The control circuit controls the levels of the RF transmit output signal and the output voltage at the output electrode of the final stage transistor.

First feedback control by the first detector and the control circuit reduces a variation in the RF transmit output signal ($P_{OUT}$) generated from the output electrode of the final stage transistor (Qn2) responsive to the load variation of the antenna upon the operation in the first operation mode.

Second feedback control by the second detector and the control circuit reduces the increase in the output voltage (Vds) of the output electrode of the final stage transistor (Qn2) responsive to the overload state of the antenna upon the operation in the second operation mode (refer to FIG. 1).

According to the embodiment, the RF transmit output signal ($P_{OUT}$) generated from the output electrode of the final stage transistor (Qn2) is maintained approximately constant by the first feedback control even if the antenna load variation has occurred in the first operation mode. Even if the overload state of the antenna has occurred in the second operation mode, the increase in the output voltage (Vds) of the output electrode of the final stage transistor (Qn2) is reduced by the second feedback control. Thus, one RF power amplifier which executes the first operation mode for the saturation type nonlinear amplification and the second operation mode for the non-saturation type linear amplification both commonly used in general single saturation-type nonlinear and nonsaturation-type linear amplifiers, can adapt to the load state and the overload state.

Further, according to the embodiment, since the increase in the output voltage (Vds) of the final stage transistor (Qn2) is reduced where the overload state of the antenna occurs in the second operation mode, an increase in adjacent channel leakage power ratio (ACPR) can be reduced.

In a preferred embodiment, the RF signal is of a constant envelope signal used in GSM communications in the first operation mode for the saturation type nonlinear amplification. In the second operation mode for the non-saturation type linear amplification, the RF signal is of an envelope change signal used in either one of EDGE and WCDMA communications.

In another preferred embodiment, the signal detector is of a directional coupler (13) having a main line and a sub-line disposed close to each other approximately in parallel.

In yet another preferred embodiment, an output matching circuit is coupled to the output electrode of the final stage transistor (Qn2). The main line of the directional coupler is coupled between the output matching circuit and the antenna. An RF detection signal responsive to the level of the RF transmit output signal is generated from the sub-line of the directional coupler.

In a further preferred embodiment, the RF power amplifier (100) includes a first-stage amplifier stage (10).

The RF signal amplified by the final-stage amplifier stage (11) is generated from the first-stage amplifier stage (10).

The first-stage amplifier stage (10) includes a first stage transistor (Qn1) which generates the RF signal. A programmable gain amplifier (21) which supplies an RF transmit input signal ($P_{IN}$) is coupled to a control input terminal of the first stage transistor.

The control circuit (15, 16 and 18) controls the programmable gain of the programmable gain amplifier (21) to thereby control the levels of the RF transmit output signal and the output voltage at the output electrode of the final stage transistor.

In one concrete embodiment, the control circuit includes an adder (15) which adds a component of the first detection signal generated from the output terminal of the first detector and a component of the second detection signal generated from the output terminal of the second detector, and a low-pass filter (16) coupled to the output of the adder.

An analog control signal of the control circuit that controls the levels of the RF transmit output signal and the output voltage at the output electrode of the final stage transistor is generated from the output of the low-pass filter (16).

In another concrete embodiment, the first stage transistor of the first-stage amplifier stage and the final stage transistor of the final-stage amplifier stage are either one of an LDMOS transistor and a hetero bipolar transistor respectively.

In the most concrete embodiment, the RF power amplifier (100) is further equipped with a current sense circuit (19) and an overcurrent detection circuit (18B).

The current sense circuit (19) includes a current sense transistor (Qn3) which has an element size smaller than the final stage transistor (Qn2) of the final-stage amplifier stage (11) and causes a sense current smaller than current flowing through the final stage transistor (Qn2) to flow therethrough.

The overcurrent detection circuit (18B) supplies an overcurrent detection signal to the control circuit (15, 16 and 18) in response to the sense current that flows through the current sense transistor (Qn3) of the current sense circuit (19).

Figure 10:
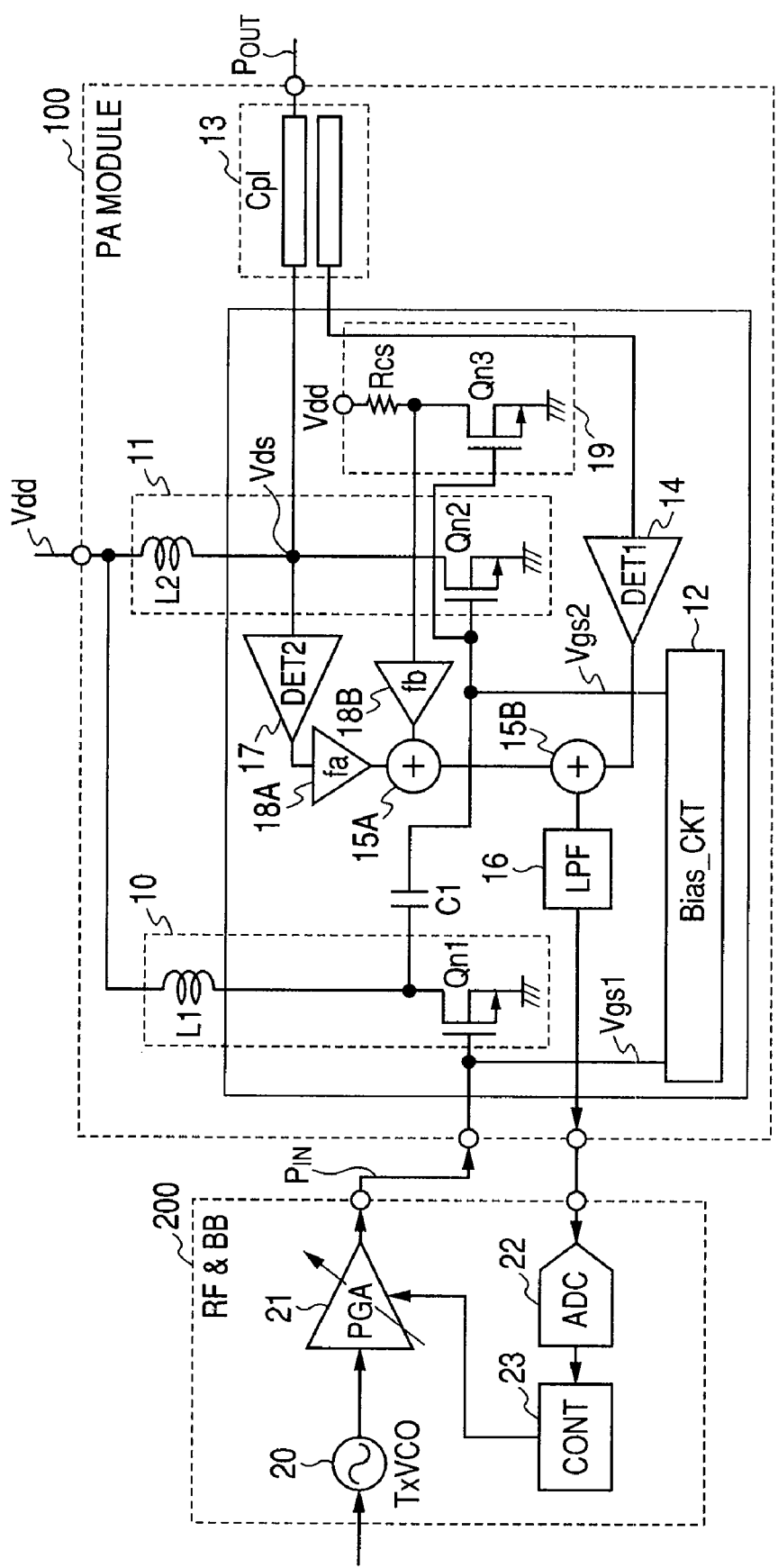
FIG. 10 is a diagram showing a configuration of an RF power amplifier to which an overcurrent protection circuit for adapting to a load short circuit when a large RF transmit signal used in GSM communications is transmitted to the RF power amplifier shown in FIG. 1.

When the current flowing through the final stage transistor (Qn2) is brought to an overcurrent state due to the load variation of the antenna where the RF power amplifier (100) operates in the first operation mode for the saturation type nonlinear amplification, the overcurrent detection circuit (18B) performs overcurrent protection of the final stage transistor (refer to FIG. 10).

[2] An RF power amplifier apparatus (100) according to a typical embodiment of another aspect of the present invention includes a first RF power amplifier and a second RF power amplifier.

The first RF power amplifier amplifies a first RF transmit input signal having a first frequency band ranging from approximately 0.8 GHz to approximately 1.0 GHz.

The second RF power amplifier amplifies a second RF transmit input signal having a second frequency band ranging from approximately 1.7 GHz to approximately 2.0 GHz.

Power amplifiers of the first RF power amplifier and the second RF power amplifier respectively include final-stage amplifier stages (11_LB, HB) each of which amplifies an RF signal to generate an RF transmit output signal supplied to an antenna of a communication terminal, and signal detectors (13_LB, HB) each of which detects the level of the RF transmit output signal.

The final-stage amplifier stage of each of the power amplifiers includes a final stage transistor (Qn2) which generates the RF transmit output signal at its output electrode, and a final stage load element (L2) coupled between the output electrode of the final stage transistor and a source or power supply voltage (Vdd).

Each of the power amplifiers executes a first operation mode for saturation type nonlinear amplification and a second operation mode for non-saturation type nonlinear amplification.

In the respective power amplifiers, the input terminals of the signal detectors (13_LB, HB) are respectively coupled to the output electrodes of the final stage transistors to thereby generate RF detection signals each responsive to the level of the RF transmit output signal from the output terminals of the signal detectors.

The power amplifiers further include first detectors (14_LB, HB), second detectors (17, 18_LB, HB) and control circuits (15_LB, HB and 16_LB, HB) respectively.

In the respective power amplifiers, the input terminals of the first detectors (14_LB, HB) are respectively supplied with the RF detection signals from the output terminals of the signal detectors (13_LB, HB) to thereby generate first detection signals from the output terminals of the first detectors (14_LB, HB).

In the respective power amplifiers, the input terminals of the second detectors (17, 18_LB, HB) are respectively coupled to the output electrodes of the final stage transistors to thereby generate second detection signals from the output terminals of the second detectors (17, 18_LB, HB).

In each power amplifier, the first detection signal generated from the output terminal of the first detector contains a first detection component responsive to a variation in the level of the RF transmit output signal due to a load variation of the antenna when the power amplifier operates in the first operation mode for the saturation type nonlinear amplification.

In each power amplifier, the second detection signal generated from the output terminal of the second detector contains a second detection component responsive to an increase in the output voltage of the output electrode of the final stage transistor due to an overload state of the antenna when the power amplifier operates in the second operation mode for the non-saturation type linear amplification.

In the power amplifiers, the first and second detectors have first and second input threshold voltages (Vth1) and (Vth2) respectively. The level of the second input threshold voltage is set higher than that of the first input threshold voltage.

In each power amplifier, the first detection signal generated from the output terminal of the first detector and the second detection signal generated from the output terminal of the second detector are supplied to the control circuit. The control circuit controls the levels of the RF transmit output signal and the output voltage at the output electrode of the final stage transistor.

In each power amplifier, first feedback control by the first detector and the control circuit reduces the variation in the RF transmit output signal generated from the output electrode of the final stage transistor responsive to the load variation of the antenna upon its operation in the first operation mode.

Figure 12:
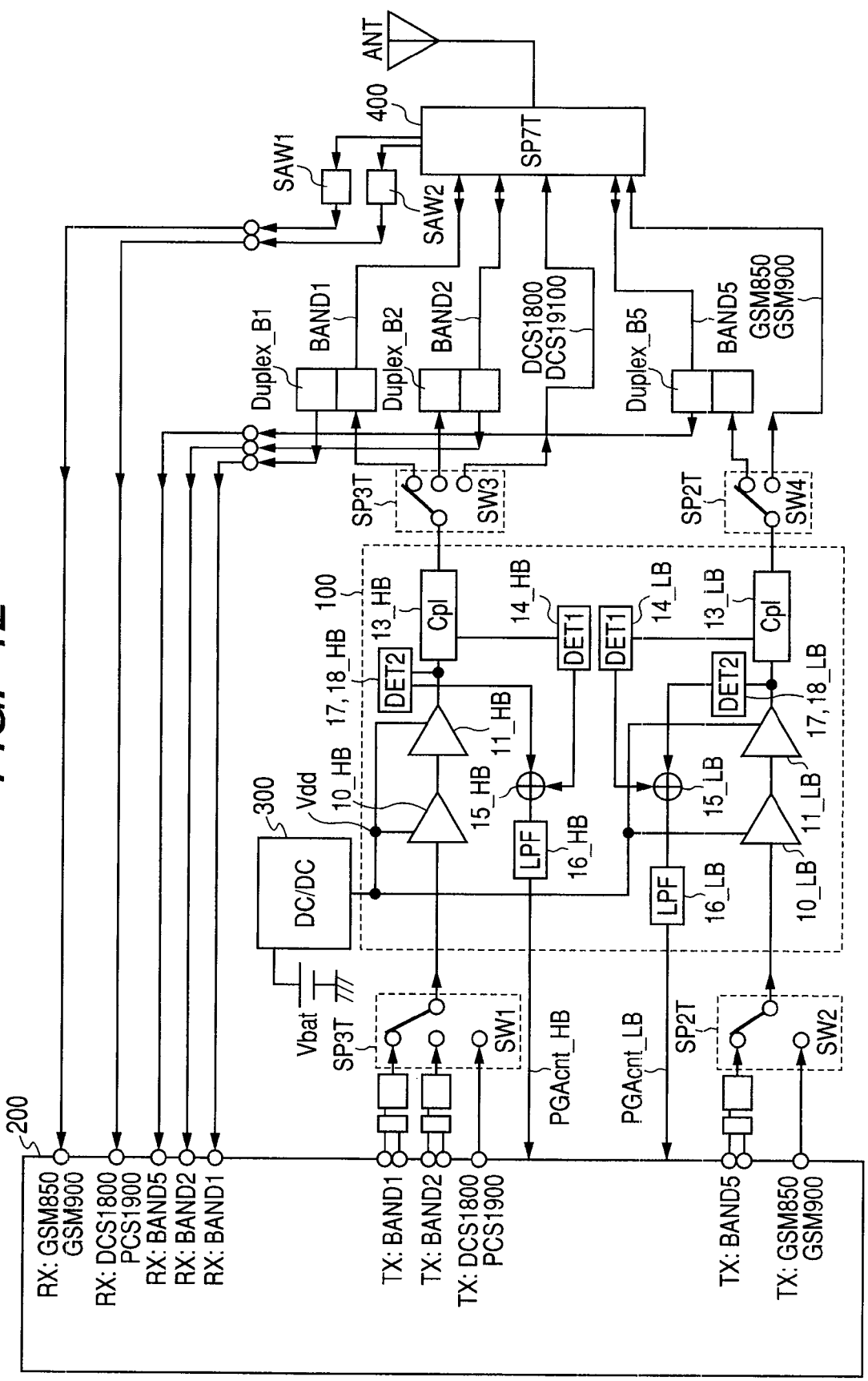
FIG. 12 is a diagram showing a configuration of a cellular phone in which an RF power amplifier according to an embodiment of the present invention and a signal processing unit are provided as a dual-band configuration that covers low and high band frequencies, and which includes a DC/DC converter, an antenna switch, duplexers or the like and an antenna.

In each power amplifier, second feedback control by the second detector and the control circuit reduces the increase in the output voltage of the output electrode of the final stage transistor responsive to the overload state of the antenna upon its operation in the second operation mode (refer to FIG. 12).

In a preferred embodiment, the RF signal is of a constant envelope signal used in GSM communications in the first operation mode for the saturation type nonlinear amplification. In the second operation mode for the non-saturation type linear amplification, the RF signal is of an envelope change signal used in either one of EDGE and WCDMA communications.

In another preferred embodiment, the signal detector in each power amplifier is of a directional coupler (13) having a main line and a sub-line disposed close to each other approximately in parallel.

In a more preferred embodiment, an output matching circuit is coupled to the output electrode of the final stage transistor in each power amplifier. The main line of the directional coupler is coupled between the output matching circuit and the antenna. An RF detection signal responsive to the level of the RF transmit output signal is generated from the sub-line of the directional coupler.

In a still more preferred embodiment, the RF power amplifiers further include first-stage amplifier stages (10_LB, HB).

In the power amplifiers, the RF signals amplified by the final-stage amplifier stages (11_LB, HB) are generated from the first-stage amplifier stages (10_LB, HB) respectively.

In the power amplifiers, the first-stage amplifier stages (10_LB, HB) include first stage transistors (Qn1) which generate the RF signals. A programmable gain amplifier (21) which supplies an RF transmit input signal ($P_{IN}$), is coupled to a control input terminal of each of the first stage transistors.

In the power amplifiers, the control circuits (15_LB, HB, 16_LB, HB and 17, 18_LB, HB) respectively controls the programmable gains of the programmable gain amplifiers (21) to thereby control the levels of the RF transmit output signals and the output voltages at the output electrodes of the final stage transistors.

In one concrete embodiment, the control circuit of each of the power amplifiers includes an adder which adds a component of the first detection signal generated from the output terminal of the first detector and a component of the second detection signal generated from the output terminal of the second detector, and a low-pass filter coupled to the output of the adder.

In each of the power amplifiers, an analog control signal of the control circuit that controls the levels of the RF transmit output signal and the output voltage at the output electrode of the final stage transistor is generated from the output of each of the low-pass filters (16_LB, HB).

In another concrete embodiment, the first stage transistors of the first-stage amplifier stages and the final stage transistors of the final-stage amplifier stages are respectively either one of an LDMOS transistor and a hetero bipolar transistor.

In the most concrete embodiment, each of the RF power amplifiers is further equipped with a current sense circuit (19) and an overcurrent detection circuit (18B).

In each of the power amplifiers, the current sense circuit (19) includes a current sense transistor (Qn3) which has an element size smaller than the final stage transistor (Qn2) of the final-stage amplifier stage (11) and causes a sense current smaller than current flowing through the final stage transistor (Qn2) to flow therethrough.

In each of the power amplifiers, the overcurrent detection circuit (18B) supplies an overcurrent detection signal to the control circuit (15, 16 and 18) in response to the sense current that flows through the current sense transistor (Qn3) of the current sense circuit (19).

When the current flowing through the final stage transistor (Qn2) is brought to an overcurrent state due to the load variation of the antenna where each of the RF power amplifiers (100) operates in the first operation mode for the saturation type nonlinear amplification, the overcurrent detection circuit (18B) performs overcurrent protection of the final stage transistor in each of the power amplifiers.

[3] An RF power amplifier (100) according to a typical embodiment of a further aspect of the present invention has a final-stage amplifier stage (11) which amplifies an RF signal to generate an RF transmit output signal ($P_{OUT}$) supplied to an antenna of a communication terminal, a control circuit (15, 16 and 18), a current sense circuit (19) and an overcurrent detection circuit (18B).

The final-stage amplifier stage includes a final stage transistor (Qn2) which generates the RF transmit output signal at its output electrode, and a final stage load element (L2) coupled between the output electrode of the final stage transistor and a source voltage (Vdd).

While the control circuit controls the level of the RF transmit output signal of the output electrode of the final stage transistor in the final-stage amplifier stage, it executes a first operation mode for saturation type nonlinear amplification and a second operation mode for non-saturation type linear amplification.

In the first operation mode for the saturation type nonlinear amplification, the RF signal is of a constant envelope signal used in GSM communications. In the second operation mode for the non-saturation type linear amplification, the RF signal is of an envelope change signal used in either one of EDGE and WCDMA communications.

The current sense circuit (19) includes a current sense transistor (Qn3) which has an element size smaller than the final stage transistor (Qn2) of the final-stage amplifier stage (11) and causes a sense current smaller than current flowing through the final stage transistor (Qn2) to flow therethrough.

The overcurrent detection circuit (18) supplies an overcurrent detection signal to the control circuit (15, 16 and 18) in response to the sense current that flows through the current sense transistor (Qn3) of the current sense circuit (19).

The RF power amplifier (100) operates in the first operation mode for the saturation type nonlinear amplification to thereby transmit the RF transmit output signal ($P_{OUT}$) of the constant envelope signal in the GSM communications.

The RF power amplifier (100) operates in the second operation mode for the non-saturation type linear amplification to thereby transmit the RF transmit output signal ($P_{OUT}$) of the envelope change signal in either one of the EDGE and WCDMA communications.

When the current flowing through the final stage transistor (Qn2) is brought to an overcurrent state due to the load variation of the antenna upon transmission of the RF transmit output signal ($P_{OUT}$) of the constant envelope signal in the GSM communications by the first operation mode of the RF power amplifier, the overcurrent detection circuit (18B) performs overcurrent protection of the final stage transistor (refer to FIG. 10).

According to the embodiment, it is possible to suppress an operating current flowing through a single type commonly-used RF power amplifier where the load of an antenna is extremely small upon GSM communications large in RF transmission power.

In a preferred embodiment, the RF power amplifier (100) further includes an output matching circuit, a directional coupler (13), a first detector (14) and a second detector (17).

The output matching circuit is coupled to the output electrode of the final stage transistor in the final-stage amplifier stage.

The directional coupler (13) has a main line and a sub-line disposed close to each other approximately in parallel. The main line is coupled between the output matching circuit and the antenna. An RF detection signal responsive to the level of the RF transmit output signal ($P_{OUT}$) is generated from the sub-line.

An input terminal of the first detector (14) is supplied with the RF detection signal from the sub-line of the directional coupler (13) to thereby generate a first detection signal from an output terminal of the first detector (14).

An input terminal of the second detector (17) is coupled to the output electrode of the final stage transistor to thereby generate a second detection signal from an output terminal of the second detector (17).

The first detection signal generated from the output terminal of the first detector (14) contains a first detection component responsive to a variation in the level of the RF transmit output signal due to a variation in load at the antenna when the RF power amplifier (100) operates in the first operation mode for the saturation type nonlinear amplification.

The second detection signal generated from the output terminal of the second detector (17) contains a second detection component responsive to an increase in output voltage (Vds) of the output electrode of the final stage transistor (Qn2) due to an overload state of the antenna when the RF power amplifier (100) operates in the second operation mode for the non-saturation type linear amplification.

The first detector (14) and the second detector (17) respectively have a first input threshold voltage (Vth1) and a second input threshold voltage (Vth2). The level of the second input threshold voltage is set higher than the level of the first input threshold voltage.

The first detection signal generated from the output terminal of the first detector and the second detection signal generated from the output terminal of the second detector are supplied to the control circuit (15, 16 and 18). The control circuit controls the levels of the RF transmit output signal and the output voltage at the output electrode of the final stage transistor.

First feedback control by the first detector and the control circuit reduces a variation in the RF transmit output signal ($P_{OUT}$) generated from the output electrode of the final stage transistor (Qn2) responsive to the load variation of the antenna upon the operation in the first operation mode.

Second feedback control by the second detector and the control circuit reduces the increase in the output voltage (Vds) of the output electrode of the final stage transistor (Qn2) responsive to the overload state of the antenna upon the operation in the second operation mode (refer to FIG. 10).

In a more preferred embodiment, the first stage transistor of the first-stage amplifier stage and the final stage transistor of the final-stage amplifier stage are respectively either one of an LDMOS transistor and a hetero bipolar transistor.

Description of Embodiment

Embodiments will next be descried in further detail.
<<Configuration of Cellular Phone Terminal>>

FIG. 1 is a diagram showing a configuration of a cellular phone terminal including an RF power amplifier 100 according to an embodiment of the present invention and a baseband digital signal processing/RF analog signal processing unit 200 which supplies an RF transmit signal to the RF power amplifier 100.

The cellular phone terminal shown in FIG. 1 performs GSM, EDGE and WCDMA communications with various base stations.

The baseband digital signal processing of the signal processing unit 200 generates a digital baseband transmit signal, which is converted to an analog baseband transmit signal by a D/A converter. The analog baseband transmit signal is frequency-upconverted to an RF transmit signal by an RF transmit signal processing unit including a transmit voltage control oscillator 20. The RF transmit signal from the transmit voltage control oscillator 20 is supplied to an RF transmit signal input terminal of the RF power amplifier 100 via a programmable gain amplifier 21.

A gain control analog signal for setting the amplification gain of the programmable gain amplifier 21 of the signal processing unit 200 is supplied from the RF power amplifier 100 to an A/D converter 22 of the signal processing unit 200. The A/D converter 22 converts the gain control analog signal to a gain control digital signal. A controller 23 sets the amplification gain of the programmable gain amplifier 21 in response to the gain control digital signal from the A/D converter 22.

<<RF Power Amplifier that Supports Multimode>>

The RF power amplifier 100 shown in FIG. 1 amplifiers an RF transmit input signal $P_{IN}$ from the signal processing unit 200 to thereby generate an RF transmit output signal $P_{OUT}$. The RF transmit output signal $P_{OUT}$ is transmitted to a base station through an antenna (not shown) of a cellular phone terminal. Upon amplification of the RF signal, the RF power amplifier 100 executes a first operation mode for saturation type nonlinear amplification used for transmitting a GMSK constant envelope signal in GSM communications, and a second operation mode for non-saturation type linear amplification used for transmitting envelop change signals of $3\pi/8$-8PSK in EDGE communications and HPSK in WCDMA communications. That is, the RF power amplifier 100 shown in FIG. 1 is used in common to the first operation mode for the saturation type nonlinear amplification and the second operation mode for the non-saturation type linear amplification. One RF power amplifier 100 executes the first operation mode and the second operation mode.

<<Configuration of RF Power Amplifier>>

The RF power amplifier 100 shown in FIG. 1 first includes a first-stage amplifier stage 10, a final-stage amplifier stage 11, a bias circuit 12 and a directional coupler 13 formed in a silicon semiconductor chip.

The first-stage amplifier stage 10 includes a common-source N channel MOS transistor Qn1 and a choke coil L1 used as a load. The source of the common-source N channel MOS transistor Qn1 is coupled to a ground voltage, the gate thereof is supplied with an RF transmit input signal $P_{IN}$ in any of GSM, EDGE and WCDMA communications, and the drain thereof is supplied with a source or power supply voltage Vdd via the choke coil L1.

In a manner similar to the first-stage amplifier stage 10, the final-stage amplifier stage 11 includes a common-source N channel MOS transistor Qn2 and a choke coil L2 used as a load. The source of the common-source N channel MOS transistor Qn2 is coupled to the ground voltage, the gate thereof is supplied with a drain amplification signal of the common-source N channel MOS transistor Qn1 of the first-stage amplifier stage 10 via a capacitor C1, and the drain thereof is supplied with the source voltage Vdd through the choke coil L2. An RF transmit output signal $P_{OUT}$ is generated from the drain of the common-source N channel MOS transistor Qn2 of the final-stage amplifier stage 11. The RF transmit output signal $P_{OUT}$ is supplied via an output matching circuit (not shown) and the directional coupler 13 to an antenna of a cellular phone terminal with the RF power amplifier 100 mounted thereto. Since the amplification gain of the final-stage amplifier stage 11 is set larger than that of the first-stage amplifier stage 10 in particular, the element size of the common-source N channel MOS transistor Qn2 of the final-stage amplifier stage 11 is set far larger than the element size of the common-source N channel MOS transistor Qn1 of the first-stage amplifier stage 10. This element size is set by a gate area based on the product of a gate width of each MOS transistor and a gate length thereof.

The common-source N channel MOS transistor Qn1 of the first-stage amplifier stage 10 and the common-source N channel MOS transistor Qn2 of the final-stage amplifier stage 11 are respectively configured by an RF amplifying LDMOS transistor lying in the silicon semiconductor chip. However, these common-source N channel MOS transistors can also be replaced with a common-emitter NPN type HBT (Hetero junction Bipolar Transistor) respectively. When the NPN type HBT is used, the element size is set by its emitter area. Incidentally, LDMOS is an abbreviation of Laterally Diffused Metal Oxide Semiconductor. Also HBT is an abbreviation of Hetero junction Bipolar Transistor.

The RF power amplifier 100 includes a bias circuit 12. The bias circuit 12 generates a bias voltage Vgs1 supplied to the gate of the common-source N channel MOS transistor Qn1 of the first-stage amplifier stage 10, and a bias voltage Vgs2 supplied to the gate of the common-source N channel MOS transistor Qn2 of the final-stage amplifier stage 11.

The bias voltages Vgs1 and Vgs2 are set to approximately constant bias voltages unrelated to variations in source voltage Vdd and ambient temperature Ta, but can also be made proportional to the level of a ramp voltage Vramp (not shown) from the signal processing unit 200. The ramp voltage Vramp is of a transmit output level instruction signal proportional to the communication distance between the cellular phone terminal and the base station. The ram voltage Vramp generated at the signal processing unit 200 in accordance with a signal received from the base station is supplied to the bias circuit 12, where the levels of the bias voltages Vgs1 and Vgs2 can be determined.

The bias voltages Vgs1 and Vgs2 can also be set as bias voltages different in the first operation mode for the saturation type nonlinear amplifier and the second operation mode for the non-saturation type linear amplification. In the first operation mode for the saturation type nonlinear amplification, for example, the bias voltages Vgs1 and Vgs2 are respectively set to such bias levels that large amplification gains are obtained at the transistors Qn1 and Qn2 of the first-stage amplifier stage 10 and the final-stage amplifier stage 11. In the second operation mode for the non-saturation type linear amplification, the bias voltages Vgs1 and Vgs2 are respectively set to such bias levels that high operation linearity can be obtained at the transistors Qn1 and Qn2 of the first-stage amplifier stage 10 and the final-stage amplifier stage 11.

In order to detect an RF transmit power level transmitted from the antenna, the directional coupler 13 is coupled via the output matching circuit (not shown) to the drain of the common-source N channel MOS transistor Qn2 of the final-stage amplifier stage 11. A main line of the directional coupler 13 is coupled between the output matching circuit (not shown) and the antenna. An RF signal proportional to the level of the RF transmit output signal $P_{OUT}$ is generated from the corresponding sub-line disposed close to the main line approximately in parallel. The directional coupler 13 has a high degree of coupling between the main line and the sub-line with respect to a traveling wave of the RF transmit output signal $P_{OUT}$ from the output of the RF power amplifier 100 to the antenna. However, the directional coupler 13 has a relatively low degree of coupling between the main line and the sub-line with respect to a reflected wave of the RF transmit output signal $P_{OUT}$ from the antenna to the output of the RF power amplifier 100 due to a load mismatch at the antenna. Thus, the level of the RF signal from the sub-line of the directional coupler 13 is approximately determined by the level of the traveling wave of the RF transmit output signal $P_{OUT}$ from the output of the RF power amplifier 100 to the antenna.

Incidentally, the choke coils L1 and L2 used as the loads of the transistors Qn1 and Qn2 of the first-stage amplifier stage 10 and the final-stage amplifier stage 11 are respectively comprised of an internal layer wiring of a multilayer wiring insulated substrate or board of a power module that forms the RF power amplifier 100. As another embodiment, however, these choke coils can also be configured by air-core coils located at the surface of the multilayer wiring insulated substrate. Further, as an alternative thereto, they can also be configured by spiral coils located at the surface of the silicon semiconductor chip.

The RF power amplifier 100 shown in FIG. 1 further includes a first detector 14, an adder 15, a low-pass filter 16, a second detector 17 and an adjustment circuit 18 formed in the silicon semiconductor chip.

The first detector 14 is used to adapt to a variation in load at the antenna of one RF power amplifier which executes the first operation mode for the saturation type nonlinear amplification and the second operation mode for the non-saturation type linear amplification. The second detector 17 is used to reduce an adjacent channel leakage power ratio (ACPR) of a single type commonly-used RF power amplifier upon adaptation to a load variation in the second operation mode for the non-saturation type linear amplification.

Since the RF signal formed from the sub-line of the directional coupler 13 is supplied to the corresponding input terminal of the first detector 14 for adapting to the load variation at the antenna, a first detection signal having a signal level of the traveling wave of the RF transmit output signal $P_{OUT}$ sent from the output of the RF power amplifier 100 to the antenna is formed from the corresponding output terminal of the first detector 14. The first detection signal is supplied to one input terminal of the adder 15.

In an overload state at the antenna of the RF power amplifier, the output voltage at the drain of the common-source N channel MOS transistor Qn2 of the final-stage amplifier stage 11 increases significantly. In doing so, signal distortion of the MOS transistor Qn2 in the second operation mode for the non-saturation type linear amplification also increases noticeably, thus causing the risk of the adjacent channel leakage power ratio (ACPR) being deteriorated significantly. Thus, the output voltage at the drain of the common-source N channel MOS transistor Qn2 of the final-stage amplifier stage 11 is supplied to its corresponding input terminal of the second detector 17 for reducing the adjacent channel leakage power ratio (ACPR) at the overload. Comparing with a relatively low first input threshold voltage Vth1 of the first detector 14, a second input threshold voltage Vth2 of the second detector 17 is set to a relatively large voltage value. A second detection signal having an excessive output voltage level of the transistor Qn2 of the final-stage amplifier stage 11 in the overload state at the antenna is formed from the corresponding output terminal of the second detector 17. The second detection signal is supplied to the other input terminal of the adder 15.

The adder 15 performs analog addition of the analog voltages of both the first detection signal from the first detector 14, which is supplied to the one input terminal, and the second detection signal from the second detector 17, which is supplied to the other input terminal via the adjustment circuit 18. A signal outputted from the adder 15 is attenuated in RF component and high-frequency noise by the low-pass filter 16 and supplied to the corresponding input terminal of the A/D converter 22 of the signal processing unit 200 as a gain control analog signal. The A/D converter 22 converts the gain control analog signal to a gain control digital signal. The controller 23 sets the amplification gain of the programmable gain amplifier 21 in response to the gain control digital signal.

Thus, when the first detection signal outputted from the output terminal of the first detector 14, which is approximately proportional to the signal level of the traveling wave of the RF transmit output signal $P_{OUT}$ from the output of the RF power amplifier 100 to the antenna becomes high, the amplification gain of the programmable gain amplifier 21 is reduced. In such a state that the antenna is brought to the overload state and the excessive output voltage level is generated from the transistor Qn2 of the final-stage amplifier stage 11, the amplification gain of the programmable gain amplifier 21 is reduced in response to the second detection signal outputted from the output terminal of the second detector 17.

<<Operation of RF Power Amplifier>> <<Adaptation to Load Variation at Antenna>>

A variation in load at the antenna occurs where the RF power amplifier 100 shown in FIG. 1 executes the first operation mode for the saturation type nonlinear amplification and the second operation mode for the non-saturation type linear amplification. Since the antenna is normally set to 50Ω, the output matching circuit between the drain of the common-source N channel MOS transistor Qn2 of the final-stage amplifier stage 11 and the antenna performs impedance matching between an extremely low output resistance of the drain of the transistor Qn2 and an impedance of 50Ω of the antenna.

Meanwhile, when the antenna of the cellular phone terminal approaches a table or the like such as a metal product, the impedance of the antenna normally set to 50Ω is reduced to a slightly low value. There are cases where a cellular phone terminal that supports a multimode communication transmits an RF transmit signal having a low band frequency of approximately 0.8 GHz to 1.0 GHz of GSM850 and GSM900 and transmits an RF transmit signal having a high band frequency of approximately 1.7 GHz to 2.0 GHz of DCS1800, PCS1900 and WCDMA 2100. Upon the transmission of the RF transmit signal having the low band frequency, the impedance of the drain of the transistor Qn2 of the final-stage amplifier stage 11 as the output terminal of the RF power amplifier 100 is reduced to a slightly low value due to the approach of the antenna to the metal. Upon the transmission of the RF transmit signal having the high band frequency, however, the impedance of the drain of the transistor Qn2 of the final-stage amplifier stage 11 as the output terminal of the RF power amplifier 100 is increased to a slightly high value due to the impedance of the output matching circuit with the approach of the antenna to the metal. As a result, the load impedance of the output terminal of the RF power amplifier 100 fluctuates in a slight range due to the load variation of the antenna.

With fluctuations in the slight range, in the load impedance of the output terminal of the RF power amplifier 100 that performs the first operation mode for the saturation type nonlinear amplification for transmission of the GMSK constant envelope signal in the GSM communications, for example, the RF transmit output signal $P_{OUT}$ from the output of the RF power amplifier 100 to the antenna also fluctuates in a slight range. When, however, the first detection signal from the output terminal of the first detector 14, approximately proportional to the signal level of the traveling wave of the RF transmit output signal $P_{OUT}$ from the output of the RF power amplifier 100 to the antenna becomes high, the amplification gain of the programmable gain amplifier 21 is reduced. As a result, even though the slight load variation at the antenna has occurred, the RF transmit output signal $P_{OUT}$ supplied from the output of the RF power amplifier 100 to the antenna can be maintained approximately constant. As a result, characteristics similar to the suppression characteristics for the load variation by the parallel RF power amplifier descried in the non-patent document 6 can be realized by the RF power amplifier 100 shown in FIG. 1, which is of the single type and small in the number of elements.

<<Adaptation to Overload State at Antenna>>

On the other hand, when the antenna of the cellular phone terminal is brought into contact with the table or the like such as the metal product, the impedance of the antenna normally set to 50Ω is reduced to a considerably low value. Incidentally, there are cases where a cellular phone terminal that supports a multimode communication transmits an RF transmit signal having a low band frequency of approximately 0.8 GHz to 1.0 GHz of GSM850 and GSM900 and transmits an RF transmit signal having a high band frequency of approximately 1.7 GHz to 2.0 GHz of DCS1800, PCS1900 and WCDMA 2100. Upon the transmission of the RF transmit signal having the low band frequency, the impedance of the drain of the transistor Qn2 of the final-stage amplifier stage 11 as the output terminal of the RF power amplifier 100 is reduced to a considerably low value near a short state due to the contact of the antenna with the metal. Upon the transmission of the RF transmit signal having the high band frequency, however, the impedance of the drain of the transistor Qn2 of the final-stage amplifier stage 11 as the output terminal of the RF power amplifier 100 is increased to a considerably high value near an open state due to the impedance of the output matching circuit with the contact of the antenna to the metal. As a result, the load impedance of the output terminal of the RF power amplifier 100 changes in a wide range from about 17Ω to about 150Ω due to the load variation of the antenna.

Figure 2:
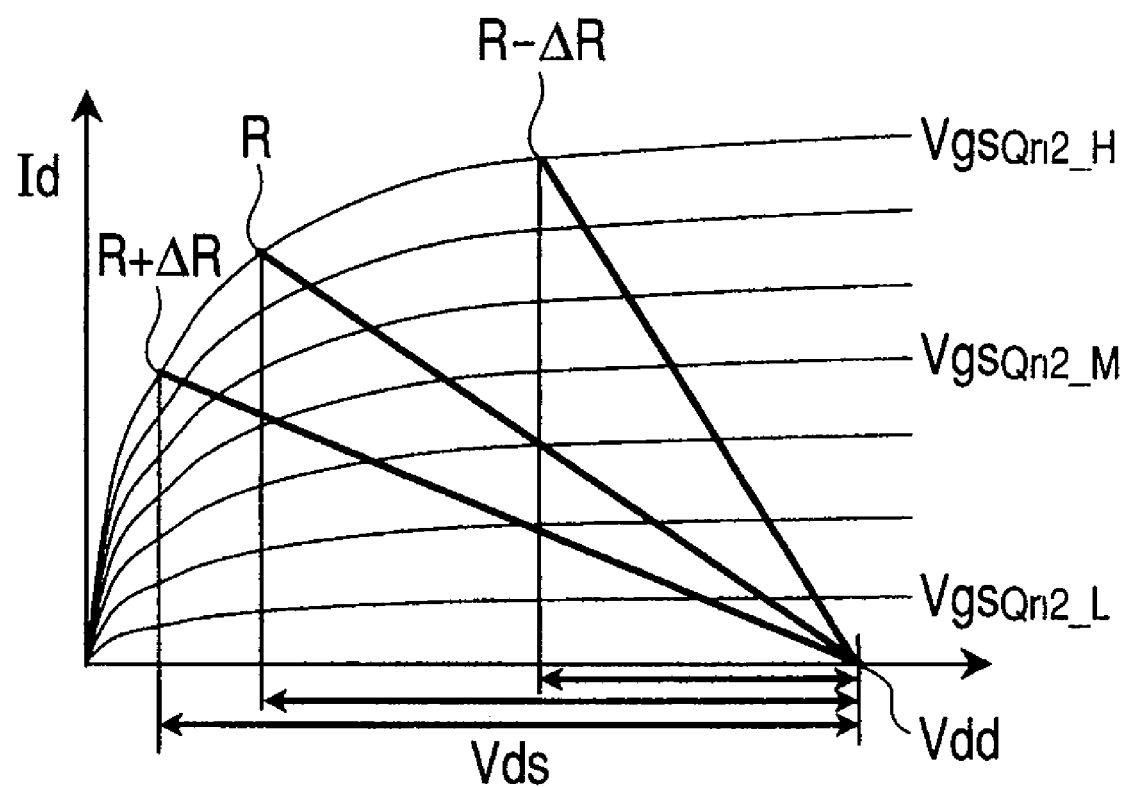
FIG. 2 is a diagram for describing the operation of the RF power amplifier of FIG. 1 when its load impedance is changed.

FIG. 2 is a diagram for describing the operation of the RF power amplifier 100 when the load impedance of the RF power amplifier 100 shown in FIG. 1 changes. The horizontal and vertical axes in FIG. 2 respectively indicate a drain-source voltage Vds and a drain current Id of the transistor Qn2 of the final-stage amplifier stage 11 in the RF power amplifier 100 shown in FIG. 1. In FIG. 2, R, R+ΔR and R−ΔR respectively indicate a state in which the input impedance (load impedance) of the output matching circuit as viewed from the drain of the transistor Qn2 of the final-stage amplifier stage 11 is a proper value, a state in which the input impedance is a value larger than the proper value and a state in which the input impedance is a value smaller than the proper value. Positive characteristics of the drain-source voltage Vds/drain current Id of the transistor Qn2 dependent on the value of a gate-source voltage VgsQn2 of the transistor Qn2 of the final-stage amplifier stage 11 are also shown in FIG. 2. Incidentally, in FIG. 2, a drain current Id of a middle level flows in response to a gate-source voltage $VgsQn2_M$ of a middle level at the transistor Qn2, a drain current Id of a high level flows in response to a gate-source voltage $VgsQn2_H$ of a high level at the transistor Qn2, and a drain current Id of a low level flows in response to a gate-source voltage $VgsQn2_L$ of a low level at the transistor Qn2.

It can be understood from FIG. 2 that when the load impedance of the RF power amplifier 100 shown in FIG. 1 changes from the state R of being the proper value to the overload state R+ΔR, the amplification gain corresponding to each of a change in the drain-source voltage Vds and a change in the drain current Id responsive to a change in the gate-source voltage VgsQn2 is reduced in a region low in the drain-source voltage Vds. When the RF power amplifier 100 shown in FIG. 1 is performing the second operation mode for the non-saturation type linear amplification, for example, the reduction in the amplification gain of the transistor Qn2 in the region low in the drain-source voltage Vds of the transistor Qn2 of the final-stage amplifier stage 11 causes an increase in signal distortion and degradation in adjacent channel leakage power ratio (ACPR).

Figure 3:
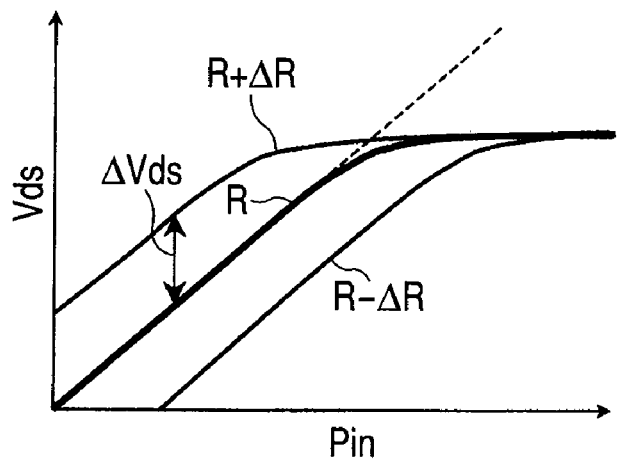
FIG. 3 is a diagram for describing the dependence of a drain-source voltage of a transistor of a final-stage amplifier stage when the load impedance of the RF power amplifier shown in FIG. 1 is brought to a state of being a value smaller than a proper value, a state of being the proper value and a state of being a value larger than the proper value.

FIG. 3 is a diagram for describing the dependence of a drain-source voltage Vds of the transistor Qn2 of the final-stage amplifier stage 11 where the load impedance of the RF power amplifier 100 shown in FIG. 1 is brought a state R−ΔR of being a value smaller than a proper value, a state R of being the proper value and a state R+ΔR of being a value larger than the proper value. The horizontal and vertical axes shown in FIG. 3 respectively indicate the RF transmit input signal $P_{IN}$ of the RF power amplifier 100 shown in FIG. 1 and the drain-source voltage Vds of the transistor Qn2 of the final-stage amplifier stage 11. As shown in FIG. 3, the drain-source voltage Vds of the transistor Qn2 of the final-stage amplifier stage 11 increases approximately linearly when the level of the RF transmit input signal $P_{IN}$ increases. When, however, the level of the RF transmit input signal $P_{IN}$ becomes excessive, the increase in the drain-source voltage Vds is gradually saturated and thereafter completely saturated. The saturation first starts in the state R+ΔR in which the load impedance of the RF power amplifier 100 is of the value larger than the proper value. Next, the saturation starts in the state R in which the load impedance is of the proper value. Finally, the saturation starts in the state R−ΔR in which the load impedance is of the value smaller than the proper value.

Figure 4:
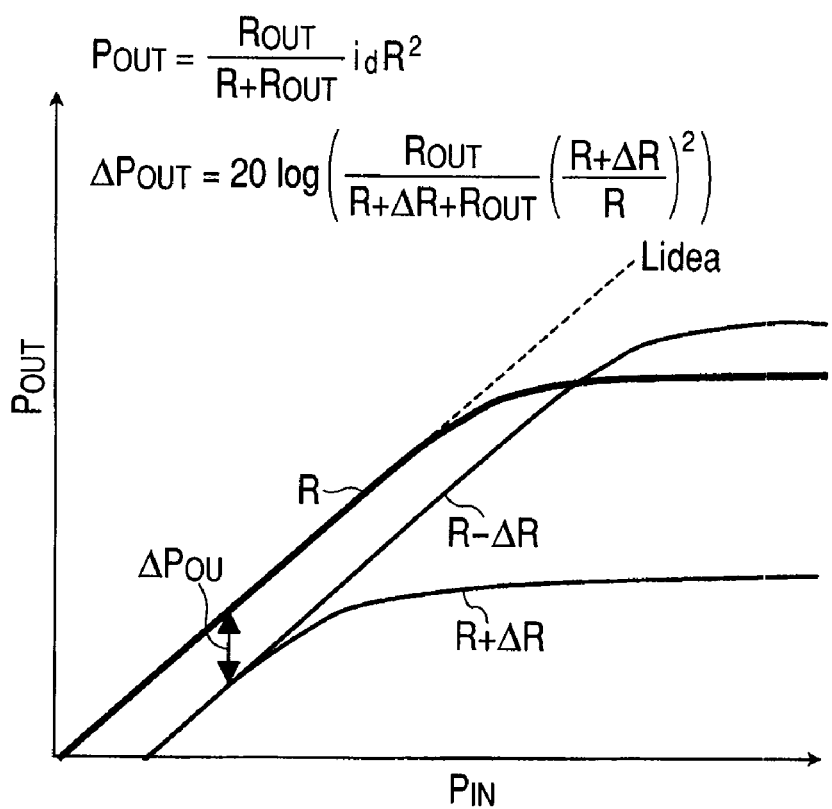
FIG. 4 is a diagram for describing the dependence of an RF transmit output signal of the RF power amplifier when the load impedance of the RF power amplifier shown in FIG. 1 is brought to a state of being a value smaller than a proper value, a state of being the proper value and a state of being a value larger than the proper value.

FIG. 4 is a diagram for describing the dependence of an RF transmit output signal $P_{OUT}$ of the RF power amplifier 100 where the load impedance of the RF power amplifier 100 shown in FIG. 1 is brought to a state R−ΔR of being a value smaller than a proper value, a state R of being the proper value and a state R+ΔR of being a value larger than the proper value.

The RF transmit output signal $P_{OUT}$ corresponds to output power. Assuming that the output impedance of the transistor Qn2 of the final-stage amplifier stage 11 is $R_{OUT}$, the load impedance of the RF power amplifier 100 is R and the drain current of the transistor Qn2 is Id, the RF transmit output signal $P_{OUT}$ is given by the following equation:

$$P_{OUT} = \frac{R_{OUT}}{R + R_{OUT}} * i_d * R^2 \qquad (1)$$

As well known, when the value of the output impedance $R_{OUT}$ and the value of the load impedance R are equal to each other, the maximum value of the RF transmit output signal $P_{OUT}$ is obtained, whereas when they are different from each other, the RF transmit output signal $P_{OUT}$ is lowered from the maximum value. Thus, as shown in FIG. 4, the RF transmit output signal $P_{OUT}$ of the non-saturated state in the state R (state in which it is equal to the value of the output impedance $R_{OUT}$) in which the load impedance of the RF power amplifier 100 is of the proper value, becomes maximum. As shown in FIG. 4, even in the state R−ΔR in which the load impedance of the RF power amplifier 100 is of the value smaller than the proper value and the state R+ΔR in which the load impedance is of the value larger than the proper value, the RF transmit output signal $P_{OUT}$ in the non-saturated state is reduced.

Assuming that a change in the load impedance of the RF power amplifier 100 due to the load variation is ΔR, a variation in the RF transmit output signal $P_{OUT}$ corresponding to the output power is given by the following equation:

$$\Delta P_{OUT} = 20 \log \left[ \frac{R_{OUT}}{R + \Delta R + R_{OUT}} \left( \frac{R + \Delta R}{R} \right)^2 \right] \qquad (2)$$

It has been demonstrated by discussions of the present inventors that the adjacent channel leakage power ratio (ACPR) corresponding to the signal distortion increases abruptly from immediately before the RF transmit output signal $P_{OUT}$ corresponding to the output power shown in FIG. 4 starts to saturate.

Figure 5:
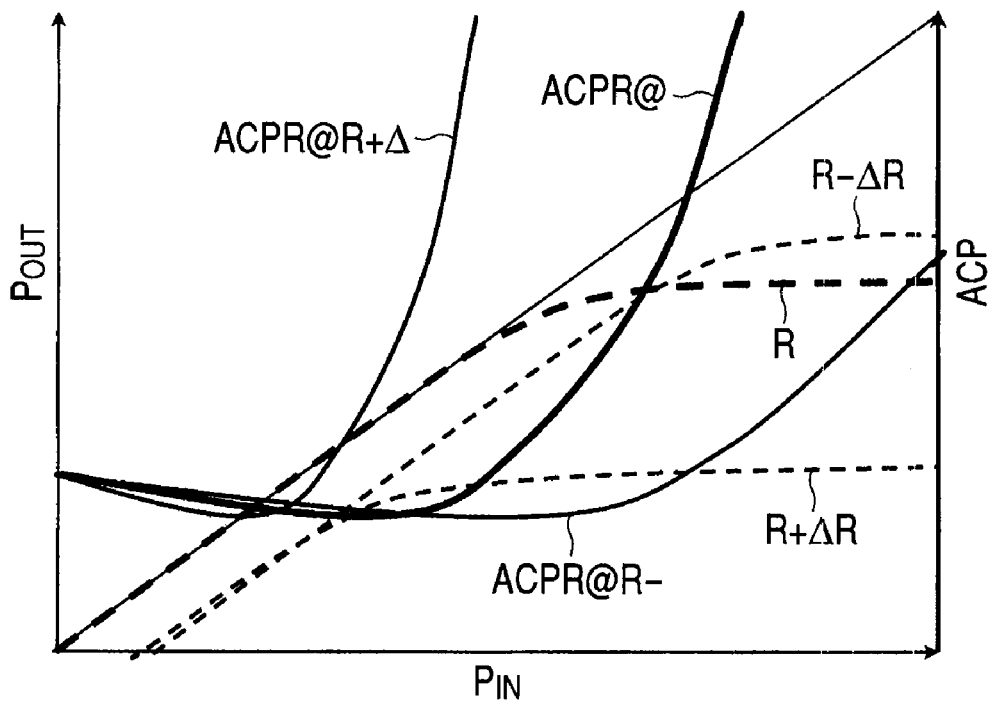
FIG. 5 is a diagram for describing the dependence between a saturation start of an RF transmit output signal of the RF power amplifier and a sudden increase in adjacent channel leakage power ratio when the load impedance of the RF power amplifier shown in FIG. 1 is brought to a state of being a value smaller than a proper value, a state of being the proper value and a state of being a value larger than the proper value.

FIG. 5 is a diagram for describing the dependence of the start of saturation of the RF transmit output signal $P_{OUT}$ of the RF power amplifier 100 and an abrupt increase in adjacent channel leakage power ratio (ACPR) where the load impedance of the RF power amplifier of FIG. 1 is brought to a state R−ΔR of being a value smaller than a proper value, a state R of being the proper value, and a state R+ΔR of being a value larger than the proper value.

In FIG. 5, a thick broken line R indicates a saturation characteristic of an RF transmit output signal $P_{OUT}$ with respect to an RF transmit input signal $P_{IN}$ in the state R in which the load impedance is of the proper value. A thick solid line ACPR@R indicates a characteristic of dependence of an adjacent channel leakage power ratio (ACPR) on an RF transmit input signal $P_{IN}$ in the state R in which the load impedance is of the proper value. In the state R in which the load impedance is of the proper value, the RF transmit output signal $P_{OUT}$ starts to saturate from an RF transmit input signal $P_{IN}$ of a middle level and the adjacent channel leakage power ratio (ACPR) starts to increase abruptly.

In FIG. 5, a thin broken line R−ΔR indicates a saturation characteristic of an RF transmit output signal $P_{OUT}$ with respect to an RF transmit input signal $P_{IN}$ in the state R−ΔR in which the load impedance is of the value smaller than the proper value. A thin solid line ACPR@R−ΔR indicates a characteristic of dependence of an adjacent channel leakage power ratio (ACPR) on an RF transmit input signal $P_{IN}$ in the state R−ΔR in which the load impedance is of the value smaller than the proper value. In the state R−ΔR in which the load impedance is of the value smaller than the proper value, the RF transmit output signal $P_{OUT}$ starts to saturate beginning with an RF transmit input signal $P_{IN}$ of a high level, and the adjacent channel leakage power ratio (ACPR) starts to increase abruptly.

In FIG. 5, a thin broken line R+ΔR indicates a characteristic of saturation of an RF transmit output signal $P_{OUT}$ with respect to an RF transmit input signal $P_{IN}$ in the state R+ΔR in which the load impedance is of the value larger than the proper value. A thin sold line ACPR@R+ΔR indicates a characteristic of dependence of an adjacent channel leakage power ratio (ACPR) on an RF transmit input signal $P_{IN}$ in the state R+ΔR in which the load impedance is of the value larger than the proper value. In the state R+ΔR in which the load impedance is of the value larger than the proper value, the RF transmit output signal $P_{OUT}$ starts to saturate easier and the adjacent channel leakage power ratio (ACPR) starts to increase abruptly. As a result, when the load impedance of the RF power amplifier shown in FIG. 1 assumes high impedance indicative of an overload state and close to an open state, the RF transmit output signal $P_{OUT}$ starts to saturate easily even at an RF transmit input signal $P_{IN}$ of a low level, and the adjacent channel leakage power ratio (ACPR) starts to increase suddenly. It has been demonstrated by discussions of the present inventors that the characteristic of the abrupt increase in ACPR in the overload state is extremely harmful to the second operation mode for the non-saturation linear amplification for the transmission of the envelop change signal of 3π/8-8PSK in the EDGE communications or HPSK in the WCDMA communications. With the abrupt increase in ACPR in the overload state, signal distortion of the envelope change signal in the EDGE or WCDMA communications increases significantly.

On the other hand, it is understood from FIG. 3 that in the overload state indicative of the state R+ΔR in which the load impedance is of the value larger than the proper value, the drain-source voltage Vds of the transistor Qn2 of the final-stage amplifier stage 11 increases significantly as compared with the drain-source voltage in the state in which the load impedance is of the proper value.

In the RF power amplifier 100 shown in FIG. 1, however, the output voltage of the drain of the common-source N channel MOS transistor Qn2 of the final-stage amplifier stage 11 has been supplied to the input terminal of the second detector 17 having the second input threshold voltage Vth2 set to the relatively large voltage value. Thus, in the RF power amplifier 100 shown in FIG. 1, a high-level overload detection signal is detected from the output terminal of the second detector 17 in the overload state indicative of the state R+ΔR in which the load impedance is of the value larger than the proper value. The high-level overload detection signal detected from the output terminal of the second detector 17 is supplied to the input terminal of the A/D converter 22 of the signal processing unit 200 via the adjustment circuit 18, adder 15 and low-pass filter 16. The A/D converter 22 converts an overload detection analog signal to an overload detection digital signal. The controller 23 reduces the amplification gain of the programmable gain amplifier 21 in response to the overload detection digital signal. Incidentally, the adjustment circuit 18 adjusts the level of the overload detection signal outputted from the second detector 17 and sets a coefficient a to a constant of 1 or less.

Thus, the level of the RF transmit input signal $P_{IN}$ supplied to the input terminal of the RF power amplifier shown in FIG. 1 is reduced with the reduction in the amplification gain of the programmable gain amplifier 21. The reduction in the amplification gain of the programmable gain amplifier 21 and the reduction in the signal of the RF transmit input signal $P_{IN}$ are executed until the high-level overload detection signal is not formed from the output terminal of the second detector 17. Thus, even in the overload state indicative of the state R+ΔR in which the load impedance is of the value larger than the proper value, an RF transmit input signal $P_{IN}$ of a signal level sufficiently lower that at the saturation start point of the RF transmit output signal $P_{OUT}$ shown in FIG. 4 is supplied to the input terminal of the RF power amplifier 100. In doing so, the RF power amplifier 100 shown in FIG. 1 is capable of reducing the abrupt increase in the adjacent channel leakage power ratio (ACPR) with the start of saturation of the RF transmit output signal $P_{OUT}$. As a result, it is possible to reduce the abrupt increases in the adjacent channel leakage power ratio (ACPR) and the signal distortion in the second operation mode for the non-saturation type linear amplification for the transmission of the envelope change signal of 3π/8-8PSK in the EDGE communications or HPSK in the WCDMA communications in the overload state.

<<First Detector and Second Detector>>

Figure 6:
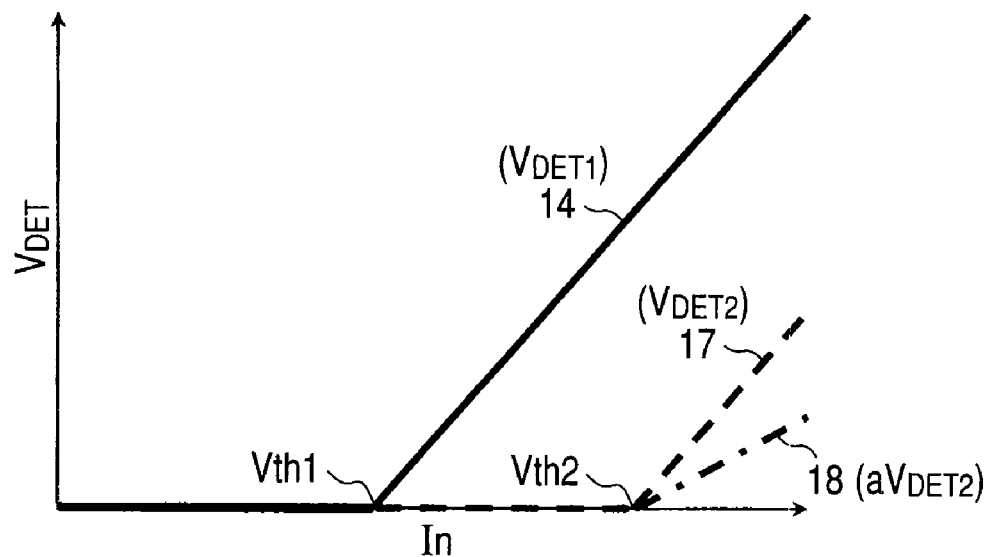
FIG. 6 is a diagram showing input/output characteristics of first and second detectors of the RF power amplifier shown in FIG. 1.

FIG. 6 is a diagram showing input/output characteristics of the first and second detectors 14 and 17 of the RF power amplifier 100 of FIG. 1.

The horizontal and vertical axes shown in FIG. 6 respectively indicate the input and output voltages of the first and second detectors 14 and 17. As described above, the second input threshold voltage Vth2 of the second detector 17 has been set to the relatively large voltage value when compared with the relatively low first input threshold voltage Vth1 of the first detector 14. Thus, the level of the output voltage (14 ($V_{DET1}$)) of the first detection signal from the first detector 14 becomes higher than that of the output voltage (17($V_{DET2}$)) of the second detection signal from the second detector 17 with respect to the corresponding input voltage In of the same level. The output voltage (18(a$V_{DET2}$)) of the adjustment circuit 18 having the coefficient a set to the constant of 1 or less is also shown in FIG. 6.

Figure 7:
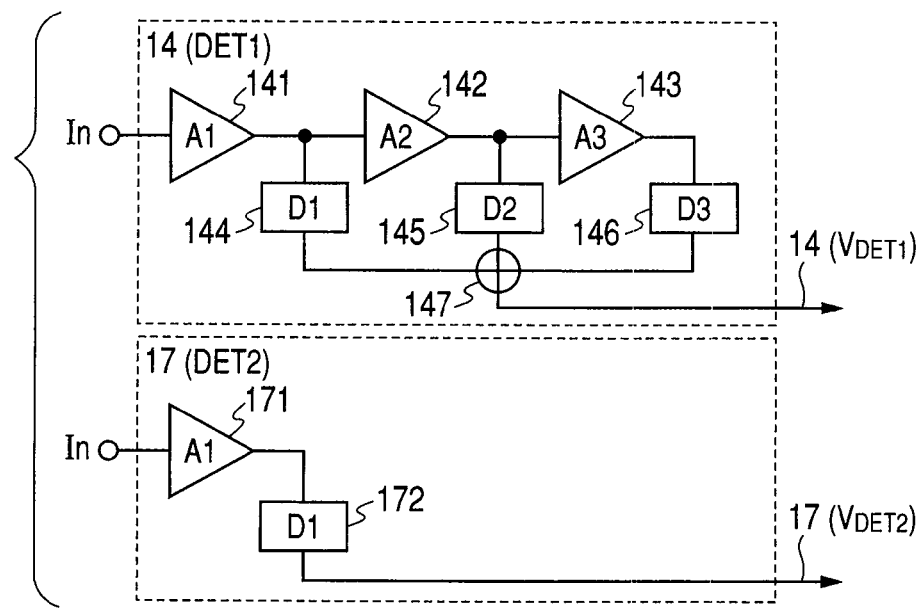
FIG. 7 is a diagram illustrating configurations of the first and second detectors of the RF power amplifier shown in FIG. 1.

FIG. 7 is a diagram showing the configurations of the first and second detectors 14 and 17 of the RF power amplifier 100 shown in FIG. 1.

As shown in FIG. 7, the first detector 14 comprises a multistage amplifier circuit including a first stage amplifier circuit 141, a second stage amplifier circuit 142 and a third stage amplifier circuit 143, a multistage detection circuit including a first stage detection circuit 144, a second stage detection circuit 145 and a third stage detection circuit 146, and an addition circuit 147. The first detector 14 can have high detection sensitivity owing to the multistage amplifier circuit and the multistage detection circuit of the first detector 14.

As shown in FIG. 7, the second detector 17 comprises a single stage amplifier circuit 171 and a single stage detection circuit 172 and can have relatively low detection sensitivity. An output level of the second detector 17 can be adjusted by the coefficient a set to the adjustment circuit 18. Further, the relatively large second input threshold voltage Vth2 set to the second detector 17 can be adjusted by at least one of a threshold voltage of an amplifier transistor of the single stage amplifier circuit 171 and a threshold voltage of a detection diode of the single stage detection circuit 172.

<<Output Matching Circuit and Directional Coupler>>

Figure 8:
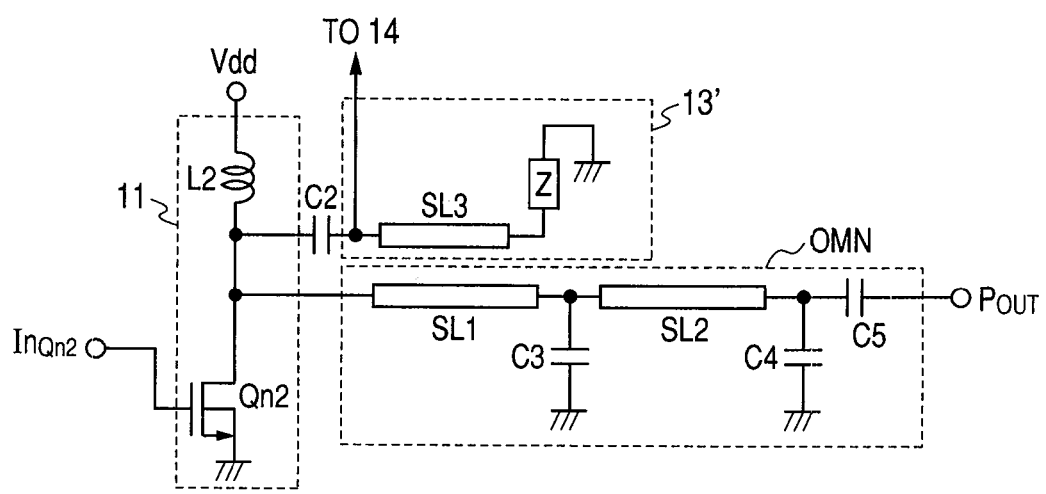
FIG. 8 is a diagram showing one example illustrative of an output matching circuit and a directional coupler both coupled to a drain output electrode of a common-source N channel MOS transistor of the final-stage amplifier stage of the RF power amplifier shown in FIG. 1.

FIG. 8 is a diagram showing one example illustrative of an output matching circuit OMN and a directional coupler 13' coupled to the drain output electrode of the common-source N channel MOS transistor Qn2 of the final-stage amplifier stage 11 in the RF power amplifier 100 shown in FIG. 1.

The output matching circuit OMN comprises strip lines SL1 and SL2 that configure inductors, and capacitors C3, C4 and C5. An input terminal of the output matching circuit OMN is coupled to the drain output electrode of the MOS transistor Qn2 of the final-stage amplifier stage 11. An RF transmit output signal $P_{OUT}$ outputted from an output terminal of the output matching circuit OMN is supplied to the antenna of the cellular phone terminal. The strip line SL1 on the input terminal side of the output matching circuit OMN also functions as a main line of the directional coupler 13'.

The directional coupler 13' comprises a strip line SL3 that forms a sub-line thereof and a terminal resistor Z. The main line SL1 and sub-line SL3 of the directional coupler 13' are disposed close to each other approximately in parallel. One end of the sub-line SL3 is supplied with an RF amplifier signal of the drain output electrode of the MOS transistor Qn2 through a capacitor C2. The other end of the sub-line SL3 is coupled to a ground voltage through the terminal resistor Z. An RF detection signal generated from one end of the sub-line SL3 is supplied to the input terminal of the first detector 14. The RF detection signal generated from one end of the sub-line SL3 is proportional to the signal level of a traveling wave of the RF transmit output signal $P_{OUT}$.

<<Adjustment Circuit Having Nonlinear Characteristic>>

Figure 9:
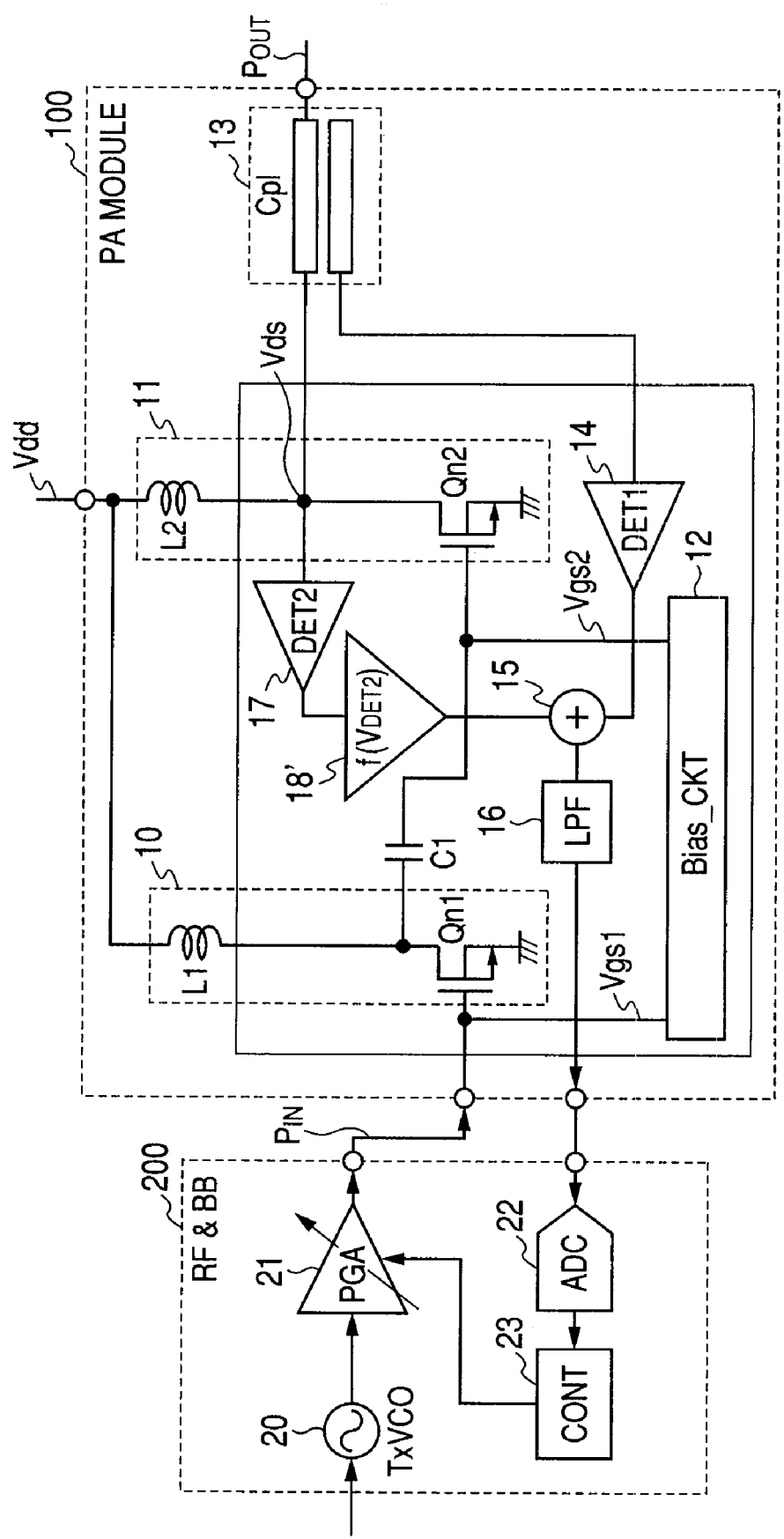
FIG. 9 is a diagram illustrating a configuration of an RF power amplifier in which an adjustment circuit mounted to the RF power amplifier shown in FIG. 1 and having coefficients set to constants greater than or equal to 1 is replaced with an adjustment circuit having non-linear characteristics.

FIG. 9 is a diagram showing a configuration of an RF power amplifier in which the adjustment circuit 18 mounted to the RF power amplifier 100 shown in FIG. 1 and having the coefficient a set to the constant of 1 or less is replaced with an adjustment circuit 18' having a nonlinear characteristic. The RF power amplifier shown in FIG. 9 is similar in other configuration to the RF power amplifier shown in FIG. 1.

The adjustment circuit 18' mounted to the RF power amplifier 100 shown in FIG. 9 has a nonlinear transfer function $f(V_{DET2})$ defined by a secondary function or a function of higher order than it or an exponential function. Thus, as the level of an output voltage (17($V_{DET2}$)) of a second detection signal from a second detector 17 increases, an output voltage (18'$f(V_{DET2})$) having a level higher than that of the output voltage (18(a$V_{DET2}$)) of the adjustment circuit 18 shown in FIG. 1 can be generated from the adjustment circuit 18' having the nonlinear characteristic.

Thus, as the level of the output voltage (17($V_{DET2}$)) of the second detection signal outputted from the second detector 17 in an overload state becomes higher than the second input threshold voltage Vth2, the level of the output voltage (18'$f(V_{DET2})$) outputted from the adjustment circuit 18' further increases. As a result, abrupt increases in adjacent channel leakage power ratio (ACPR) and signal distortion in the second operation mode for the non-saturation type linear amplification for the transmission of the envelope change signal in the EDGE or WCDMA communications in the overload state can be reduced further effectively.

<<Adaptation to Overcurrent State>>

In order to adapt to the antenna load variation as described above, the amplification gain of the programmable gain amplifier 21 is controlled in accordance with the signal level of the traveling wave of the RF transmit output signal $P_{OUT}$ from the RF power amplifier 100 in the first operation mode for the saturation type nonlinear amplification for the transmission of the constant envelope signal in the GSM communications to thereby maintain the RF transmit output signal $P_{OUT}$ approximately constant.

As compared with the WCDMA and EDGE communications, however, the maximum RF transmit output signal $P_{OUT\ (MAX)}$ in the GSM communications, of the RF power amplifier that performs the first operation mode for the saturation type nonlinear amplification to transmit the constant envelope signal is extremely large like an approximately 2.0 watts in the first operation mode for the saturation type nonlinear amplification.

Meanwhile, the impedance of the drain of the transistor Qn2 of the final-stage amplifier stage 11 in the RF power amplifier 100 of FIG. 1 is reduced to a considerably low value near a short state due to the contact of the antenna with the metal upon transmission of the RF transmit signal extremely large in constant envelope signal in the GSM communications at the low band frequency. In doing so, the drain current Id of the transistor Qn2 of the final-stage amplifier stage 11 is brought to an extremely large overcurrent state. Thus, the wearing out of a battery of the cellular phone terminal becomes noticeable and the risk of the transistor Qn2 of the final-stage amplifier stage 11 being destroyed also occurs. Accordingly, it has been demonstrated by discussions of the present inventors that it is necessary to adapt to the overcurrent state of the output transistor of the final-stage amplifier stage due to the load short-circuit of the RF power amplifier that performs the saturation type nonlinear amplification to transmit the constant envelope signal in the GSM communications.

FIG. 10 is a diagram showing a configuration of an RF power amplifier wherein an overcurrent protection circuit for adapting to a load short-circuit at the transmission of a large RF transmit signal in the GSM communications is added to the RF power amplifier 100 shown in FIG. 1. The RF power amplifier shown in FIG. 10 is similar in other configuration to the RF power amplifier shown in FIG. 1.

The overcurrent protection circuit added to the RF power amplifier 100 shown in FIG. 10 includes a current sense circuit 19, an overcurrent detection circuit 18B and an adder 15A. The current sense circuit 19 comprises a current sense N channel MOS transistor Qn3 whose gate control input terminal is supplied with a gate control input signal of a common-source N channel MOS transistor Qn2 of a final-stage amplifier stage 11 of the RF power amplifier 100, and a current sense resistor Rcs. The source of the current sense transistor Qn3 is coupled to a ground voltage and the drain thereof is coupled to a source voltage Vdd through the current sense resistor Rcs. An element size of the current sense transistor Qn3 is set considerably smaller than an element size of the RF amplifier transistor Qn2, whereby a sense current flowing through the current sense transistor Qn3 at the load short-circuit can be reduced.

Even at the normal operation and the load short-circuit, the sense current flowing through the transistor Qn3 is converted to a sense voltage by the current sense resistor Rcs. The sense voltage applied between both ends of the current sense resistor Rcs is monitored by the overcurrent detection circuit 18B. For example, the overcurrent detection circuit 18B has an input threshold voltage. When the sense voltage of the current sense resistor Rcs exceeds the input threshold voltage, the level of an overcurrent detection output signal becomes high. The high-level overcurrent detection output signal outputted from the overcurrent detection circuit 18B is transmitted to the corresponding A/D converter 22 of the signal processing unit 200 via the adder 15A, adder 15B and low-pass filter 16. The controller 23 reduces the amplification gain of the programmable gain amplifier 21 in response to an overcurrent detection digital signal outputted from the A/D converter 22.

Thus, the increases in the sense current flowing through the current sense transistor Qn3 at the load short-circuit and RF current flowing through the RF amplifier transistor Qn2 of the final-stage amplifier stage 11 are stopped in such a manner that the sense voltage of the current sense resistor Rcs does not exceed the input threshold voltage of the overcurrent detection circuit 18B. As a result, the overcurrent protection circuit including the current sense circuit 19, the overcurrent detection circuit 18B and the adder 15A performs an overcurrent protecting operation of current limiter type in the RF power amplifier 100 shown in FIG. 10.

As another embodiment, when the sense voltage of the current sense resistor Rcs exceeds the input threshold voltage of the overcurrent detection circuit 18B once upon the load short-circuit, a latch circuit can be set from a reset state indicative of an initial state to a set state based on overcurrent detection by the high-level overcurrent detection output signal outputted from the overcurrent detection circuit 18B. The controller 23 is controlled by a signal outputted from the latch circuit set to the set state to thereby make it possible to reduce the amplification gain of the programmable gain amplifier 21 to zero. Such an overcurrent protection circuit performs an overcurrent protecting operation of shutdown type. Its subsequent operation resumption is enabled by changing the latch circuit from the set state to the reset state.

<<Independent Feedback>>

Figure 11:
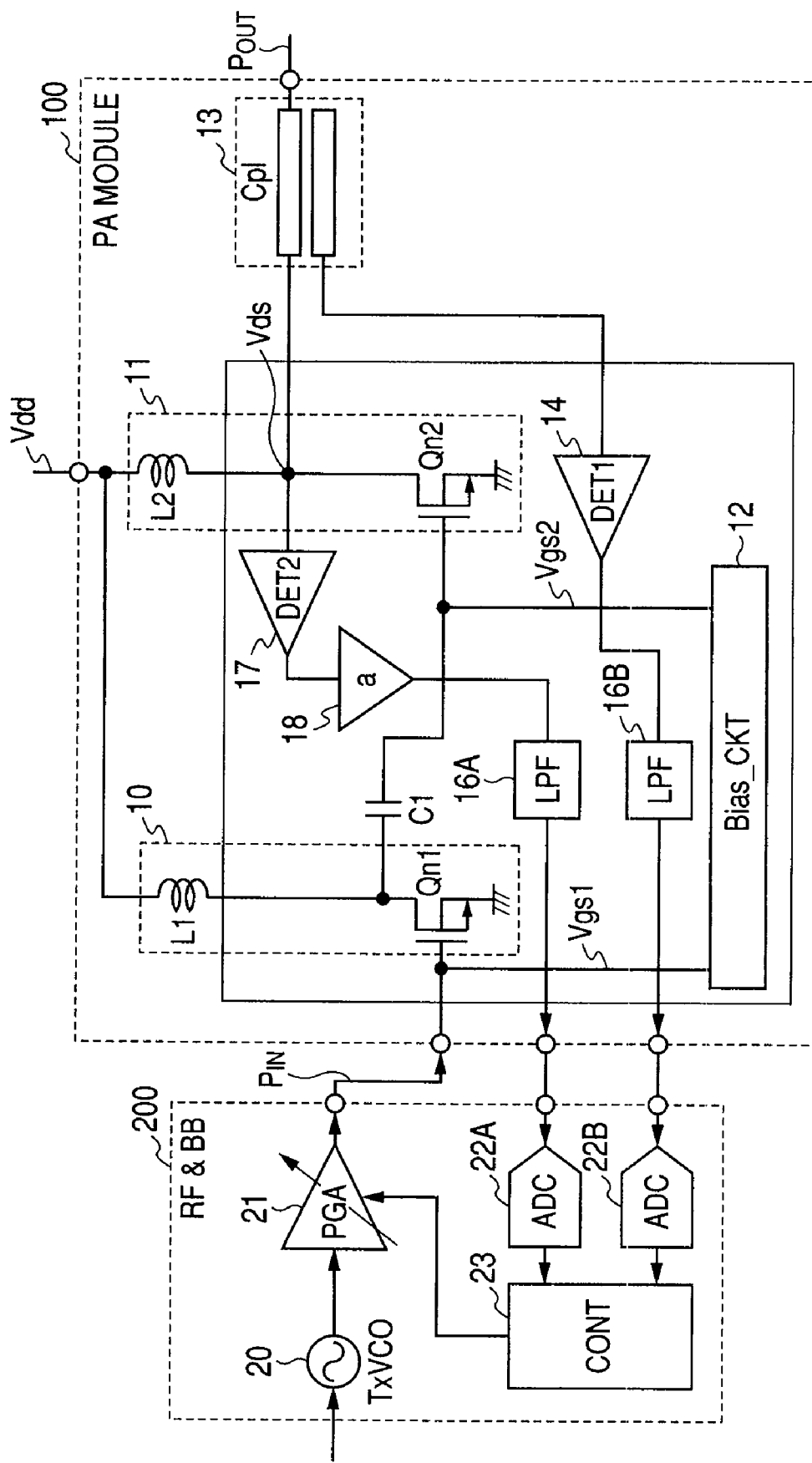
FIG. 11 is a diagram illustrating a configuration of an RF power amplifier wherein in the RF power amplifier shown in FIG. 1, first feedback from the output of the first detector to a controller of a signal processing unit and second feedback from the output of the second detector to the controller of the signal processing unit are rendered independent.

FIG. 11 is a diagram showing a configuration of an RF power amplifier wherein in the RF power amplifier 100 shown in FIG. 1, first feedback from the output of the first detector 14 to the controller 23 of the signal processing unit 200 and second feedback from the output of the second detector 17 to the controller 23 of the signal processing unit 200 are rendered independent of each other. The RF power amplifier shown in FIG. 11 is similar in other configuration to the RF power amplifier shown in FIG. 1.

The first feedback comprised of a low-pass filter 16B and an A/D converter 22B is used to stabilize an RF transmit output signal $P_{OUT}$ adaptable to a load variation The second feedback comprised of an adjustment circuit 18, a low-pass filter 16A and an A/D converter 22A is used to reduce abrupt increases in the adjacent channel leakage power ratio (ACPR) and signal distortion in the second operation mode for the non-saturation type linear amplification upon transmission of the envelope change signal in the EDGE or WCDMA communications in the overload state.

Since the first feedback and the second feedback are independently disposed in the RF power amplifier 100 shown in FIG. 11, the present RF power amplifier is simple as compared with the RF power amplifier in which the two feedback have been combined as shown in FIG. 1, an advantage is brought about in that circuit design becomes easy.

<<Configuration of Cellular Phone>>

FIG. 12 is a diagram showing a configuration of a cellular phone in which an RF power amplifier 100 according to an embodiment of the present invention and a signal processing unit 200 are provided as a dual-band configuration that covers low and high band frequencies, and which includes a DC/DC converter 300, an antenna switch 400, duplexers or the like and an antenna ANT. In the cellular phone having the configuration shown in FIG. 12, any of the RF power amplifier shown in FIG. 1, the RF power amplifier shown in FIG. 9, the RF power amplifier shown in FIG. 10 and the RF power amplifier shown in FIG. 11 can be adopted as the RF power amplifier 100.

The DC/DC converter 300 is of a back-boost converter and can cover a back operation mode and a boost operation mode. With the supply of a battery voltage Vbat from a battery mounted to the cellular phone to the DC/DC converter 300, a source or power supply voltage Vdd supplied to the RF power amplifier 100 is generated from the DC/DC converter 300. When a high RF transmit output signal $P_{OUT}$ in the GSM communications is transmitted when the battery voltage Vbat from the battery is low, the DC/DC converter 300 is set to the boost operation mode. When a low RF transmit output signal $P_{OUT}$ is transmitted where the battery voltage Vbat from the battery is high in reverse, the DC/DC converter 300 is set to the back operation mode, thereby making it possible to improve power added efficiency (PAE). Incidentally, PAE is an abbreviation of Power Added Efficiency.

The antenna switch 400 comprises a single pole 7 throw (SP7T) type switch. In the field of the antenna switch, a common input/output terminal I/O coupled to the antenna ANT is called "Single Pole", and other terminals such as transmission terminals, reception terminals, transmission/reception terminals are called "Throw".

Incidentally, the low band frequency is of an RF transmit signal frequency ranging from approximately 0.8 GHz to 1.0 GHz of GSM850 and GSM900. The high band frequency is of an RF transmit signal frequency corresponding to a high band frequency ranging from approximately 1.7 GHz to 2.0 GHz of DCS1800, PCS1900 and WCDMA2100.

The RF power amplifier 100 shown in FIG. 12 includes a first-stage amplifier stage 10_LB, a final-stage amplifier stage 11_LB, a directional coupler 13_LB, a first detector 14_LB, an adder 15_LB, a low-pass filter 16_LB, and a second detection/adjustment circuit 17, 18_LB, which cover the low band frequency. These circuits that cover the low band frequency in the RF power amplifier shown in FIG. 12 are operated in a manner similar to the RF power amplifier 100 shown in FIG. 1 as to the stabilization of an RF transmit output signal $P_{OUT}$ adaptable to a load variation and a reduction in the increase of an adjacent channel leakage power ratio in a second operation mode at the transmission of an envelope change signal in an overload state. As a result, a lowband gain control signal PGAcnt_LB for controlling the amplification gain of a lowband programmable gain amplifier that covers the low band frequency of the signal processing unit 200 is generated from the circuits that cover the low band frequency of the RF power amplifier 100 shown in FIG. 12.

The RF power amplifier 100 shown in FIG. 12 includes a first-stage amplifier stage 10_HB, a final-stage amplifier stage 11_HB, a directional coupler 13_HB, a first detector 14_HB, an adder 15_HB, a low-pass filter 16_HB and a second detection/adjustment circuit 17, 18_HB, which cover the high band frequency. These circuits that cover the high band frequency in the RF power amplifier 100 shown in FIG. 12 are operated in a manner similar to the RF power amplifier 100 shown in FIG. 1 as to the stabilization of the RF transmit output signal $P_{OUT}$ adaptable to the load variation and the reduction in the increase of the adjacent channel leakage power ratio in the second operation mode at the transmission of the envelope change signal in the overload state. As a result, a highband gain control signal PGAcnt_HB for controlling the amplification gain of a highband programmable gain amplifier that covers the high band frequency of the signal processing unit 200 is generated from the circuits that cover the high band frequency of the RF power amplifier 100 shown in FIG. 12.

The signal processing unit 200 shown in FIG. 12 generates an RF transmit signal of a low band frequency to the RF power amplifier 100 from its lower part. As the RF transmit signal of the low band frequency, there may be mentioned the following: RF transmit signals TX of GSM850 and GSM900: GSM850 and GSM900, and RF transmit signal TX of WCDMA at BAND 5: BAND5. The frequency of the RF transmit signal of GSM850 is set to 824 to 849 MHz. The frequency of the RF transmit signal of GSM900 is set to 889 to 915 MHz. The frequency of the RF transmit signal of WCDMA at BAND5 is set to 824 to 849 MHz exactly identical to GSM850. The RF transmit signals of GSM850 and GSM900 and the RF transmit signal of WCDMA at BAND5 are selected by a signal pole 2 throw (SP2T) type switch SW2 and supplied to the input terminal of the first-stage amplifier stage 10_LB that covers the low band frequency of the RF power amplifier 100 shown in FIG. 12. A lowband RF amplifier output signal sent from the output terminal of the final-stage amplifier stage 11_LB that covers the low band frequency of the RF power amplifier 100 shown in FIG. 12 is supplied to a single pole 2 throw type switch SW4 via the directional coupler 13_LB. The lowband RF amplifier output signal for each of GSM850 and GSM900 is selected by the switch SW4 and supplied to the antenna ANT via the single pole 7 throw type antenna switch 400. The lowband RF amplifier output signal for the WCDMA of BAND5 is selected by the switch SW4 and supplied to the antenna ANT via the duplexer Duplx_B5 and the antenna switch 400.

The signal processing unit 200 shown in FIG. 12 generates an RF transmit signal of a high band frequency to the RF power amplifier 100 from its central part. As the RF transmit signal of the high band frequency, there may be mentioned the following: RF transmit signals TX for DCS1800 and PCS1900 in GSM system: DCS1800 and PCS1900, and RF transmit signals TX for BAND1 and BAND2 in WCDMA system: BAND1 and BAND2. The frequency of the RF transmit signal of DCS1800 in the GSM system is set to 1710 to 1785 MHz, and the frequency of the RF transmit signal of PCS1900 in the GSM system is set to 1850 to 1910 MHz. The frequencies of the RF transmit signals corresponding to RF transmit signals TX in the WCDMA system: BAND1 and BAND2 are respectively set to 1920 to 1980 MHz and 1850 to 1910 MHz. The RF transmit signals of DCS1800 and PCS1900 in the GSM system and the RF transmit signals TX corresponding to the RF transmit signals in the WCDMA system: BAND1 and BAND2 are selected by a single pole 3 throw type switch SW1 and supplied to the input terminal of the first-stage amplifier stage 10_HB that covers the high band frequency of the RF power amplifier 100 shown in FIG. 12. A lowband RF amplifier output signal from the output terminal of the final-stage amplifier stage 11_HB that covers the high hand frequency of the RF power amplifier 100 shown in FIG. 12 is supplied to a single pole 3 throw type switch SW3 via the directional coupler 13_HB. A highband RF amplifier output signal for each of DCS1800 and PCS1900 in the GSM system is selected by the switch SW3 and supplied to the antenna ANT through the single pole 7 throw type antenna switch 400. The highband RF amplifier output signals for BAND1 and BAND2 of WCDMA are selected by the switch SW3 and supplied to the antenna ANT via the duplexer Duplx_B1, duplexer Duplx_B2 and antenna switch 400.

The signal processing unit 200 shown in FIG. 12 is supplied with RF receive signals of low band and high band frequencies received by the antenna ANT from its upper part. As the RF receive signals for the low band frequency, there may be mentioned the following: RF receive signals RX of GSM850 and GSM900: GSM850 and GSM900 and RF receive signal RX of WCDMA at BAND5: BAND5. The frequency of the RF receive signal of GSM850 is set to 869 to 894 MHz, and the frequency of the RF receive signal of GSM900 is set to 925 to 950 MHz. The frequency of the RF receive signal of WCDMA at BAND5 are set to 869 to 894 MHz exactly identical to GSM850. The RF receive signals of GSM850 and GSM900 are supplied to the signal processing unit 200 via the single pole 7 throw type antenna switch 400 and a surface acoustic wave filer SAW1. The RF receive signal of WCDMA at BAND5 is supplied to the signal processing unit 200 via the single pole 7 throw antenna switch 400 and duplexer Duplx_B5.

The RF receive signals for the high band frequency are as follows: RF receive signals RX of DCS1800 and PCS1900 in GSM system: DCS1800 and PCS1900, and RF receive signals RX in WCDMA system at BAND1 and BAND2: BAND1 and BAND2. The frequency of the RF receive signal of DCS1800 in the GSM system is set to 1805 to 1850 MHz. The frequency of the RF receive signal of PCS1900 in the GSM system is set to 1930 to 1990 MHz. The frequencies of the RF receive signals corresponding to the RF receive signals RX in the WCDMA system: BAND1 and BAND2 are respectively set to 2110 to 2170 MHz and 1930 to 1990 MHz. The RF receive signals of DCS1800 and PCS1900 are supplied to the signal processing unit 200 via the single pole 7 throw antenna switch 400 and a surface acoustic wave filter SAW2. The RF receive signals of WCDMA at BAND1 and BAND2 are supplied to the signal processing unit 200 via the single pole 7 throw type antenna switch 400 and the duplexers Duplx_B1 and Duplx_B2.

While the invention made above by the present inventors has been described specifically on the basis of the preferred embodiments, the present invention is not limited to the embodiments referred to above. It is needless to say that various changes can be made thereto without the scope not departing from the gist thereof.

For example, the directional coupler for detecting the level of the RF transmit output signal $P_{OUT}$ of the RF power amplifier can be replaced with a simple capacitor. An AC sense signal based on the capacitor is detected by the envelope detector as described in the non-patent document 4. A detected voltage is compared with a reference voltage by the error amplifier, and a bias current of a drive stage for driving a final stage by the output of the error amplifier can also be controlled.

The RF power amplifier 100 can be comprised of a multi-stage amplifier stage having three or more stages, in which an intermediate-stage amplifier stage is coupled between the first-stage amplifier stage 10 and the final-stage amplifier stage 11.

In the above embodiment of the present invention, the amplification gain of the programmable gain amplifier of the signal processing unit 200 has been controlled upon stabilization of the RF transmit output signal $P_{OUT}$ adaptable to the load variation and the reduction in the increase in adjacent channel leakage power ratio in the second operation mode at the transmission of the envelop change signal in the overload state. The present invention is not limited to this system. Upon such a case, the control bias voltage at the gate control electrode or base control electrode of at least either one of the transistors of the first-stage amplifier stage 10 and the final-stage amplifier stage 11 can also be controlled to control the amplification gain of the RF power amplifier. That is, when the RF transmit output signal $P_{OUT}$ increases due to the load variation and the adjacent channel leakage power ratio increases in the second operation mode at the transmission of the envelope change signal in the overload state, the control bias voltage of the transistor is reduced and the amplification gain of the RF power amplifier is reduced.

Further, it is recommended that when each of the common-source N channel MOS transistors of the first-stage amplifier stage 10 and the final-stage amplifier stage 11 is replaced with a common-emitter NPN type HBT, a base ballast resistor or an emitter ballast resistor is coupled to the HBT to prevent thermal runaway of the HBT.

What is claimed is:

1. An RF power amplifier comprising:
a final stage amplifier stage which generates an RF transmit output signal;
a signal detector which detects an RF transmit output level;
a first detector;
a second detector, and
a control circuit,
wherein the final stage amplifier stage performs the saturation type nonlinear amplification and the non-saturation type linear amplification and includes:
a transistor, and
a load element,
wherein an RF detection signal outputted from the signal detector is supplied to the first detector, and an output voltage of the final stage transistor is supplied to the second detector,
wherein the first detector and the control circuit maintain the RF transmit output signal approximately constant with respect to a variation in load at an antenna at the saturation type nonlinear amplification, and
wherein the second detector and the control circuit reduce an increase in the output voltage of the final stage transistor with respect to an overload state of the antenna at the non-saturation type linear amplification.

2. An RF power amplifier comprising:
a final stage amplifier stage which amplifies an RF signal to generate an RF transmit output signal supplied to an antenna of a communication terminal; and
a signal detector which detects the level of the RF transmit output signal,
a first detector,
a second detector, and
a controller or control circuit,
wherein the final stage amplifier stage includes a final stage transistor and a final stage load element and executes a first operation mode for saturation type nonlinear amplification and a second operation mode for non-saturation type linear amplification,
wherein the first detector is supplied with an RF detection signal from the signal detector, and
wherein the second detector is supplied with an output voltage of the final stage transistor.

3. An RF power amplifier according to claim 2,
wherein a first feedback control by the first detector and the control circuit reduces a variation in the RF transmit output signal generated from the final stage transistor responsive to a variation in load at the antenna in the first operation mode, and
wherein a second feedback control by the second detector and the control circuit reduces an increase in the output voltage of the final stage transistor responsive to an overload state of the antenna in the second operation mode.

* * * * *